(12) United States Patent
Perrott et al.

(10) Patent No.: US 10,175,119 B1
(45) Date of Patent: Jan. 8, 2019

(54) TEMPERATURE SENSOR WITH FREQUENCY-CONTROLLED REFERENCE

(71) Applicant: SiTime Coporation, Santa Clara, CA (US)

(72) Inventors: Michael H. Perrott, Nashua, NH (US); Shungneng Lee, Sunnyvale, CA (US)

(73) Assignee: SiTime Corporation, Santa Clara, CA (US)

( * ) Notice: Subject to any disclaimer, the term of this patent is extended or adjusted under 35 U.S.C. 154(b) by 4 days.

(21) Appl. No.: 15/364,179

(22) Filed: Nov. 29, 2016

Related U.S. Application Data

(62) Division of application No. 14/927,864, filed on Oct. 30, 2015, now Pat. No. 9,523,615, which is a division of application No. 13/607,603, filed on Sep. 7, 2012, now Pat. No. 9,182,295.

(60) Provisional application No. 61/533,149, filed on Sep. 9, 2011.

(51) Int. Cl.
*G01K 7/34* (2006.01)
*G01K 7/16* (2006.01)
*G01K 7/22* (2006.01)

(52) U.S. Cl.
CPC ............. *G01K 7/226* (2013.01); *G01K 7/34* (2013.01)

(58) Field of Classification Search
CPC .. G01K 7/01; G01K 7/14; G01K 7/16; G01K 7/17; G01K 7/34; G01K 7/24; G01K 7/226
USPC ............... 374/183, 184, 185, 170–173, 163
See application file for complete search history.

(56) References Cited

U.S. PATENT DOCUMENTS

| | | |
|---|---|---|
| 4,625,197 A | 11/1986 | Holmes |
| 4,814,692 A | 3/1989 | Baumann |
| 4,841,458 A | 6/1989 | Levine et al. |
| 4,864,513 A | 9/1989 | Levine |
| 4,970,474 A | 11/1990 | Kennedy et al. |
| 4,972,446 A | 11/1990 | Kennedy et al. |
| 5,440,305 A | 8/1995 | Signore et al. |
| 5,552,648 A | 9/1996 | Cook et al. |
| 6,075,400 A | 6/2000 | Wu |
| 6,242,974 B1 | 6/2001 | Kunst |
| 6,617,963 B1 | 9/2003 | Walters |
| 6,847,319 B1 | 1/2005 | Stockstad |
| 6,853,252 B2 | 2/2005 | Dickmann |
| 6,888,413 B1 | 5/2005 | Adams et al. |
| 6,962,436 B1 | 11/2005 | Holloway et al. |
| 7,082,377 B1 | 7/2006 | Aslan et al. |
| 7,312,648 B2 | 12/2007 | Yang |

(Continued)

FOREIGN PATENT DOCUMENTS

| | | |
|---|---|---|
| KR | 87058 | 9/2008 |
| WO | 2008023710 A1 | 2/2008 |

OTHER PUBLICATIONS

Desgrez, et al., "A New MMIC Sampling Phase Detector Design for Space Applications," IEEE JSSC, vol. 38, pp. 1438-1442, Sep. 2003.

(Continued)

*Primary Examiner* — Gail Kaplan Verbitsky
(74) *Attorney, Agent, or Firm* — Charles Shemwell

(57) ABSTRACT

The temperature-dependent resistance of a MEMS structure is compared with an effective resistance of a switched CMOS capacitive element to implement a high performance temperature sensor.

20 Claims, 28 Drawing Sheets

(56) References Cited

U.S. PATENT DOCUMENTS

| | | | |
|---|---|---|---|
| 7,339,384 B2 * | 3/2008 | Peng | G01D 5/24 |
| | | | 324/658 |
| 7,413,912 B2 | 8/2008 | Chen et al. | |
| 7,586,347 B1 | 9/2009 | Ren et al. | |
| 7,612,618 B2 | 11/2009 | Ko et al. | |
| 7,746,257 B2 | 6/2010 | Schneider et al. | |
| 7,795,947 B2 | 9/2010 | Zamprogno et al. | |
| 8,009,077 B1 | 8/2011 | Melanson | |
| 8,092,083 B2 | 1/2012 | Venkataraman et al. | |
| 8,258,854 B2 | 9/2012 | Pan | |
| 8,262,286 B2 | 9/2012 | Peterson et al. | |
| 8,299,826 B2 | 10/2012 | Perrott | |
| 8,775,111 B1 | 7/2014 | Walker et al. | |
| 8,901,778 B2 | 12/2014 | Kesler et al. | |
| 8,957,549 B2 | 2/2015 | Kesler et al. | |
| 8,959,994 B2 | 2/2015 | Tai | |
| 9,022,644 B1 | 5/2015 | Arft | |
| 9,058,048 B2 * | 6/2015 | Teong | G05F 1/46 |
| 9,523,615 B1 * | 12/2016 | Perrott | G01K 7/226 |
| 9,677,948 B1 * | 6/2017 | Arft | G01K 7/226 |
| 2003/0090277 A1 | 5/2003 | Lechner et al. | |
| 2003/0090300 A1 | 5/2003 | Nix | |
| 2005/0017889 A1 | 1/2005 | Stockstad | |
| 2005/0151575 A1 | 7/2005 | Sibrai et al. | |
| 2005/0219097 A1 | 10/2005 | Atriss et al. | |
| 2005/0237042 A1 | 10/2005 | Yoshida et al. | |
| 2007/0035347 A1 | 2/2007 | Sasaki | |
| 2007/0164829 A1 | 7/2007 | Ko | |
| 2007/0290741 A1 | 12/2007 | Forbes | |
| 2008/0106322 A1 | 5/2008 | Jeong | |
| 2008/0129391 A1 | 6/2008 | Ko et al. | |
| 2009/0009234 A1 | 1/2009 | St. Pierre et al. | |
| 2009/0121912 A1 | 5/2009 | Zanchi et al. | |
| 2009/0201969 A1 | 8/2009 | Krauss et al. | |
| 2009/0219129 A1 | 9/2009 | Denier et al. | |
| 2009/0273402 A1 | 11/2009 | Ruffieux | |
| 2010/0073051 A1 | 3/2010 | Rao et al. | |
| 2011/0215847 A1 | 9/2011 | Al-Shahrani | |
| 2011/0291871 A1 | 12/2011 | Lin et al. | |
| 2012/0032522 A1 | 2/2012 | Schatz et al. | |
| 2013/0175874 A1 | 7/2013 | Lou et al. | |
| 2014/0002291 A1 | 1/2014 | Atriss et al. | |
| 2014/0269839 A1 | 9/2014 | Tai et al. | |

OTHER PUBLICATIONS

Gao et al., "A 2.2GHz 7.6mW Sub-Sampling PLL with—126dBc/Hz In-band Phase Noise and 0.15ps rms Jitter in 0.18um CMOS," Proceedings of IEEE ISSCC, pp. 392-393, 2009.

Gardner, "Charge-Pump Phase-Lock Loops," IEEE Transactions on Communications, vol. COM-28, pp. 1849-1858, Nov. 1980.

Hedayati et al., "A 3GHz wideband Sigma-Delta fractional-N synthesizer with voltage-mode exponential CP-PFD," IEEE Radio Frequency integrated Circuits Symp., pp. 325-328, Jun. 2009.

Henry et al., "Comparative analysis of MEMS, programmable, and synthesized frequency control devices versus traditional quartz based devices," Proc. IEEE Frequency Control Symp., pp. 396-401, May 2008.

Hsu et al., "A Low-Noise Wide-BW 3.6-GHz Digital Delta-Sigma Fractional-N Frequency Synthesizer With a Noise-Shaping Time-to-Digital Converter and Quantization Noise Cancellation," IEEE JSSC, vol. 43, pp. 2776-2786, Dec. 2008.

Hu et al., "A 750 uW 1.575GHz temperature-stable FBAR-based PLL," IEEE Radio Frequency Integrated Circuits Symposium, pp. 317-320, Jun. 2009.

Kaehler, "Periodic-Switching Filter Networks—A Means of Amplifying and Varying Transfer Functions," IEEE JSSC, vol. 4, pp. 225-230, Aug. 1969.

Kurahashi et al., "A 0.6V Highly Linear Switched-R-MOSFET-C Filter," Proc. of the IEEE 2006 Custom Integrated circuits Conference, pp. 833-836, Sep. 2006.

Kurahashi et al., "Design of Low-Voltage Highly Linear Switched-R-MOSFET-C Filters," IEEE JSSC, vol. 42, pp. 1669-1709, Aug. 2007.

McCorquodale et al., "A 0.5 to 480 MHz self-referenced CMOS clock generator with 90ppm total frequency error and spreadspectrum capability," Proc. of IEEE ISSCC, pp. 350-619, Feb. 2008.

McCorquodale et al., "A Monolithic and self-referenced RF LC clock generator compliant with USB 2.0," IEEE JSSC, vol. 42, pp. 385-399, Feb. 2007.

Otis et al., "A 300 uW 1.9GHz CMOS oscillator utilizing micromachined resonators," IEEE JSSC, vol. 38, pp. 1271-1274, Jul. 2003.

Perrott et al., "A Low Area, Switched-Resistor Based Fractional-N Synthesizer Applied to a MEMS-based Programmable Oscillator," IEEE ISSC, vol. 45, pp. 244-245, Feb. 2010.

Perrott et al., "A Low Area, Switched-Resistor Based Fractional-N Synthesizer Applied to a MEMS-based Programmable Oscillator," IEEE JSSC, vol. 45, pp. 2566-2581, Dec. 2010.

Perrott et al., "A Low-Area Switched-Resistor Loop-Filter Technique for Fractional-N Synthesizers Applied to a MEMS Based Programmable Oscillator," Proc. of IEEE ISSCC, pp. 244-245, Feb. 2010.

Perrott et al., "A Modeling Approach for Sigma-Delta Fractional-N Frequency Synthesizers Allowing Straightforward Noise Analysis," IEEE JSSC, vol. 37, Aug. 2002.

Perrott, "CppSim System Simulator." http://www.cppsim.com.

Petit et al., "Thermally stable oscillator at 2.5 GHz using temperature compensated BAW resonator and its integrated temperature sensor," Proc. IEEE Ultrasonics Symp., pp. 895-898, Nov. 2008.

Rai et al, "A Digitally Compensated 1.5 GHz CMOS/FBAR Frequency Reference," IEEE Trans. on Ultrasonics, Ferroelectrics, and Frequency Control, vol. 57, pp. 552-561, Mar. 2010.

Rhee, "Design of high-performance CMOS charge pumps in phase-locked loops," IEEE International Symp. on Circuits and Systems, vol. 2, pp. 545-548, 1999.

Riley et al., "Delta-Sigma Modulation in Fractional-N Frequency Synthesis," IEEE JSSC, vol. 28, pp. 553-559, May 1993.

Stark et al., "An Ultra-Thin Packaged MEMS Oscillator," Solid-State Sensors, Actuators, and Microsystems Workshop, pp. 6-9, Jun. 2008

Vaucher et al., "A Family of Low-Power Truly Modular Programmable Dividers in Standard 0.35-um CMOS Technology," IEEE JSSC, vol. 35, pp. 1039-1045, Jul. 2000.

Wang et al., "Spurious Tone Suppression Techniques Applied to a Wide-Bandwidth 2.4 GHz Fractional-N PLL," IEEE JSSC, vol. 43, pp. 2787-2797, Dec. 2008.

Mang et al., "A fast switching PLL frequency synthesizer with an on-chip passive discrete-time loop filter in 0.25um CMOS," IEEE JSSC, vol. 38, pp. 855-865, Jun. 2003.

* cited by examiner

TEMPERATURE SENSOR WITH FREQUENCY-CONTROLLED REFERENCE

CROSS-REFERENCE TO RELATED APPLICATIONS

This non-provisional application is a divisional of U.S. application Ser. No. 14/927,864, entitled "Capacitor-Referenced Temperature Sensing" and filed Oct. 30, 2015 (now U.S. Pat. No. 9,521,615), which is a divisional of U.S. application Ser. No. 13/607,603, entitled "Circuitry and Techniques for Resistor-Based Temperature Sensing" and filed Sep. 7, 2012 (now U.S. Pat. No. 9,182,295), which claims priority to U.S. Provisional Application No. 61/533,149, entitled "Circuitry and Techniques for Resistor-Based Temperature Sensing" and filed Sep. 9, 2011 (hereinafter "the Provisional Application"). Each of the foregoing applications is hereby incorporated by reference herein in its entirety.

INTRODUCTION

In one aspect, the present inventions are directed to circuitry and techniques to determine, calculate, measure and/or sample temperature dependent characteristics (and/or changes therein) of a temperature sensitive device (for example, a micromachined thermistor structure). In one embodiment, the temperature dependent characteristics (and/or changes therein) of the temperature sensitive device is resistance or change in resistance of the temperature sensitive device.

In another aspect, the present inventions are directed to circuitry and techniques to provide low noise temperature sensing of a temperature dependent resistive element with high accuracy, low power, and/or low area using (i) a switched capacitor network that provides or creates a low noise adaptable reference resistor for comparison purposes, (ii) a frequency divider that is controlled by a digital Sigma-Delta modulator to achieve an accurately controlled switching frequency for the switched capacitor network, (iii) chopping circuitry and method to mitigate the effect of 1/f noise and circuit offsets, (iv) a pseudo-differential VCO-based analog-to-digital converter (ADC) structure, or other ADC topology, to efficiently convert the analog error between the MEMS-based resistance value and the effective resistance of the switched capacitor network into a digital code, and (v) feedback loop that changes the Sigma-Delta modulator input in response to error data. Notably, in one embodiment, the temperature dependent resistive element is a micromachined thermistor structure as described in ATTACHMENT A of the Provisional Application.

With that in mind, while temperature sensors are currently manufactured at low cost for a wide variety of applications, the existing solutions have various shortcomings, for example, with respect to achieving low noise performance with relatively high sample rates (i.e., greater than 100 Hz), low integrated area, and low power operation. For MEMS-based clock applications, low noise is advantageous to achieve low Allan deviation and high accuracy is advantageous to achieve the desired output frequency. A wide variety of other applications would also benefit from improved performance of the temperature sensor.

Briefly, by way of background, FIG. 1 shows a simplified view of the core circuit component of many modern integrated temperature sensors. As seen in the figure, an output signal $\Delta V_{be}$ is produced as the difference between the base-to-emitter voltages of two bipolar transistors (i.e., $\Delta V_{be} = V_{be1} - V_{be2}$). Based on fundamental bipolar device physics, it can be shown that (to first order):

$$\Delta V_{be} = \frac{kT}{q} \ln\left(\frac{A_2 I_1}{A_1 I_2}\right)$$

where k is Boltzmann's constant (1.38e-23), T is temperature in degrees Kelvin, q is the elementary charge (1.6e-19), $A_1$ and $A_2$ are the emitter areas of the left and right transistors in the figure, respectively, and $I_1$ and $I_2$ are the collector currents of the left and right transistors in the figure, respectively.

Assuming that the ratio $(A_2 I_1)/(A_1 I_2)$ has a value on the order of 8, $\Delta$Vbe ends up having a positive temperature sensitivity of approximately 180 microvolts per degree Celsius. Since k and q are fundamental constants, and the relative area and currents of transistors can be well controlled within an integrated circuit, this bipolar approach to temperature sensing provides a robust temperature signal (in the form of voltage) across process variations. As such, the core circuit shown in FIG. 1, along with its many variations, has become a common approach for achieving integrated silicon temperature sensors.

Despite the prevalence of the bipolar based temperature sensor approach, it presents design and implementation challenges when trying to achieve low noise. From the design standpoint, achieving low noise is complicated by the fact that the temperature sensitivity of $\Delta V_{be}$ is quite small at approximately 180 microvolts per degrees Celsius. The achievement of a low noise temperature sensor using this circuit at its core typically requires the design of low noise operational amplifiers and reasonably large sampling capacitors to reduce the effect of kT/C noise when sampling. When striving for faster sampling speeds, the presence of the larger capacitors requires higher current consumption in the operational amplifiers. Thus, design for low noise has negative consequences of requiring larger area and power consumption, and, of course, also carries the cost of a difficult design effort.

In contrast to the bipolar approach, here we consider using, among other things, a resistive element as the key temperature sensitive device. An advantage of this configuration is that the resulting sensitivity of the voltage signal due to temperature variations when using a resistor may be much higher than encountered with the classical bipolar approach. This increased sensitivity may provide improved noise performance for a given amount of area and power compared to the classical bipolar approach due to the relatively smaller impact of a given level of noise. Other aspects of the present inventions are described below.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, certain permutations and combinations are not discussed and/or illustrated separately herein.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed and/or illustrated separately herein.

Figure 1:
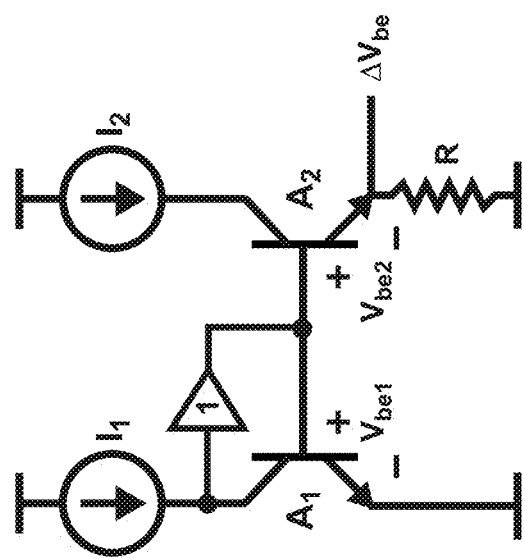
FIG. 1 is a schematic block diagram representation of a core circuit component of a conventional bipolar-based temperature sensor.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

It should be noted that there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, for example, (i) a switched capacitor network that provides or creates a low noise adaptable reference resistor for comparison purposes, (ii) a frequency divider that is controlled by a digital Sigma-Delta modulator to achieve an accurately controlled switching frequency for the switched capacitor network, (iii) chopping circuitry and method to mitigate the effect of 1/f noise and circuit offsets, (iv) a pseudo-differential VCO-based analog-to-digital converter (ADC) structure, or other ADC topology, to efficiently convert the analog error between the MEMS-based resistance value and the effective resistance of the switched capacitor network into a digital code, and (v) feedback loop that changes the Sigma-Delta modulator input in response to error data, may be employed alone or in combination with one or more of the other aspects of the present inventions and/or embodiments. For the sake of brevity, many of the permutations and combinations may not be discussed separately herein.

Further, in the course of describing and illustrating the present inventions, various structures, components, materials and/or elements, as well as combinations and/or permutations thereof, are set forth. It should be understood that structures, components, materials and/or elements other than those specifically described and illustrated, are contemplated and are within the scope of the present inventions, as well as combinations and/or permutations thereof.

Thus, the present inventions, in one aspect, are directed to circuitry and techniques to determine, calculate, measure and/or sample temperature dependent characteristics (and/or changes therein) of a temperature sensitive device (for example, a micromachined thermistor structure). With that in mind, the description of the present inventions may be generally organized and characterized, to include among other things:

1) a switched capacitor network, for example, a network that provides or creates a low noise adaptable reference resistor for comparison purposes;
2) a chopping circuit and technique in the core resistor comparison network for mitigating the impact of 1/f noise and DC offsets while allowing a simple circuit implementation for the overall system;
3) a pulsed based biasing circuit and technique that is utilized in conjunction with the proposed chopping technique to greatly lower the impact of noise sources from the voltage supply, bias currents, and feedback resistors within the amplifiers;
4) a digital to resistance architecture that leverages a switched capacitor network, frequency divider (and accompanying input frequency reference), and digital Sigma-Delta modulator to achieve very repeatable resistor value control with high resolution across a wide range;
5) a mixed-signal feedback architecture that makes use of a differential VCO-based quantizer or other ADC structure to efficiently translate the analog error signal representing the difference between the temperature sensitive resistor and the reference resistor formed by the switched capacitor network into a digital value that is processed by digital logic to control the reference resistor value;
6) One or more of the circuit and techniques described herein, in any combination or permutation described, in combination with micromachined thermistor structure that achieves excellent robustness against stress effects and may be highly coupled, from a thermally perspective, to one or more mechanical structures of MEMS devices (for example, a MEMS resonator).

Importantly, the present inventions are neither limited to any single aspect nor embodiment thereof, nor to any combinations and/or permutations of such aspects and/or embodiments. Moreover, each of the aspects of the present inventions, and/or embodiments thereof, for example, (i) a switched capacitor network that provides or creates a low noise adaptable reference resistor for comparison purposes, (ii) a frequency divider that is controlled by a digital Sigma-Delta modulator to achieve an accurately controlled switching frequency for the switched capacitor network, (iii) chopping circuitry and method to mitigate the effect of 1/f noise and circuit offsets, (iv) a pseudo-differential VCO-based analog-to-digital converter structure, or other ADC topology, to efficiently convert the analog error between the MEMS-based resistance value and the effective resistance of the switched capacitor network into a digital code, and (v) feedback loop that changes the Sigma-Delta modulator input in response to error data, may be employed alone or in combination with one or more of the other aspects of the present inventions and/or embodiments thereof. All such combinations and permutations are intended to fall within the scope of the present inventions.

Aspects of Core Elements of a Resistor-Based Temperature Sensor

Figure 2:
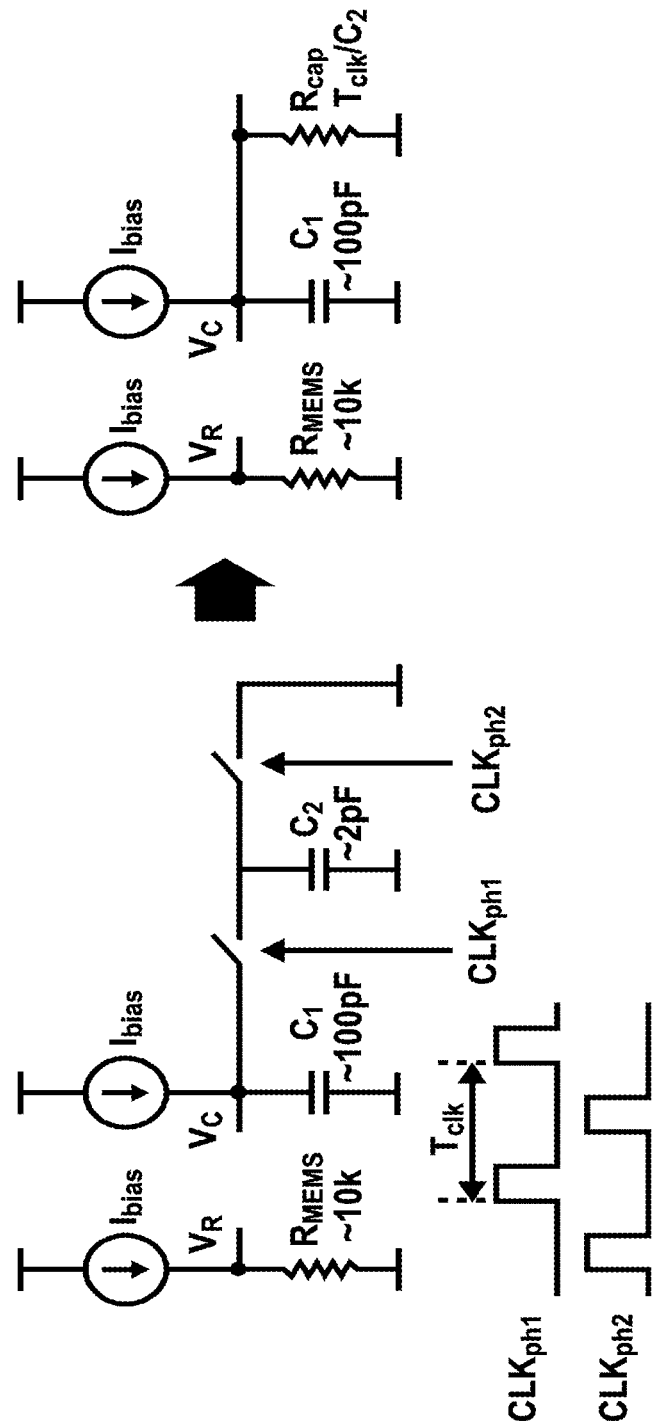
FIG. 2 illustrates an exemplary embodiment of a conceptual view of temperature sensing utilizing a temperature sensitive resistor, $R_{MEMS}$, and switched capacitor network that yields a controlled reference resistor with effective value $R_{cap}$, according to certain aspects of the present inventions; note that the numerical values indicated in the figure are exemplary and, in practice, may generally depend on a given fabrication technology and application.

FIG. 2 illustrates a conceptual view of generating a voltage that is sensitive to temperature based on a temperature sensitive resistor, denoted as $R_{MEMS}$, and a reference resistor formed by a switched capacitor network whose effective resistance is denoted as $R_{cap}$. In this conceptual view, matching bias currents are fed into each of these resistors in order to form a voltage signal, $V_R - V_C$, which is a function of the difference in resistor values, $R_{MEMS}-R_{cap}$, such that the voltage difference is zero when the resistor values are matched. By sensing this voltage difference within a feedback loop that controls the reference resistor value, $R_{cap}$, the value of $R_{cap}$ may be set to accurately track $R_{MEMS}$ across a wide range of temperature variation with the aid of a feedback loop. As such, if a digital value controls the setting of $R_{cap}$, that same digital value will provide an accurate, digitized representation of temperature assuming that the feedback loop is properly designed for stability and accuracy.

In one embodiment, the temperature sensitive resistor (for example, the micromachined thermistor structure) may be constructed in a variety of ways, including integrated polysilicon resistors, metal resistors from a variety of materials including aluminum or copper (such as from on-chip wiring), tungsten (such as from contacts or vias), or a MEMS based silicon resistor which will be the default focus of this document. Also note that the resistor may also be implemented as an external component to the circuits that interact with it to extract the temperature signal, whether the resistive element utilizes MEMS technology or other construction (See, for example, ATTACHMENT A of the Provisional Application). The reference resistor value, $R_{cap}$, need not be temperature insensitive so long as its temperature characteristic is repeatable and sufficiently different from $R_{MEMS}$. One advantage of using the switched capacitor network to realize $R_{cap}$ is that its effective resistance value is set to first order by the switching frequency, $1/T_{clk}$, and capacitor value $C_2$ as:

$$R_{cap}=T_{clk}/C_2$$

As such, the resistor value may be controlled by changing either the capacitor value $C_2$ or the switching frequency $1/T_{clk}$. In the exemplary implementation, we propose to have $C_2$ as a configurable value that may selected during an initial calibration phase in order to compensate for process variations in $R_{MEMS}$.

As an example, let us assume that $C_2$ is nominally set to be on the order of 2 pF in order to achieve reasonably low area for an integrated implementation, and $R_{MEMS}$ is nominally on the order of 10 kiloOhms in order to balance the requirements of achieving low noise and low power consumption, then the nominal switching frequency, $1/T_{clk}$, will be 50 MHz. Each of these settings is reasonable in achieving a compact implementation with low power consumption. It should be clear that a given application and fabrication technology may lend itself to alternative nominal values for these components and switching frequency than assumed here, but we will assume these nominal values as exemplary and in order to simplify the discussion. Indeed, such nominal values do not limit the invention in any manner.

Figure 3:
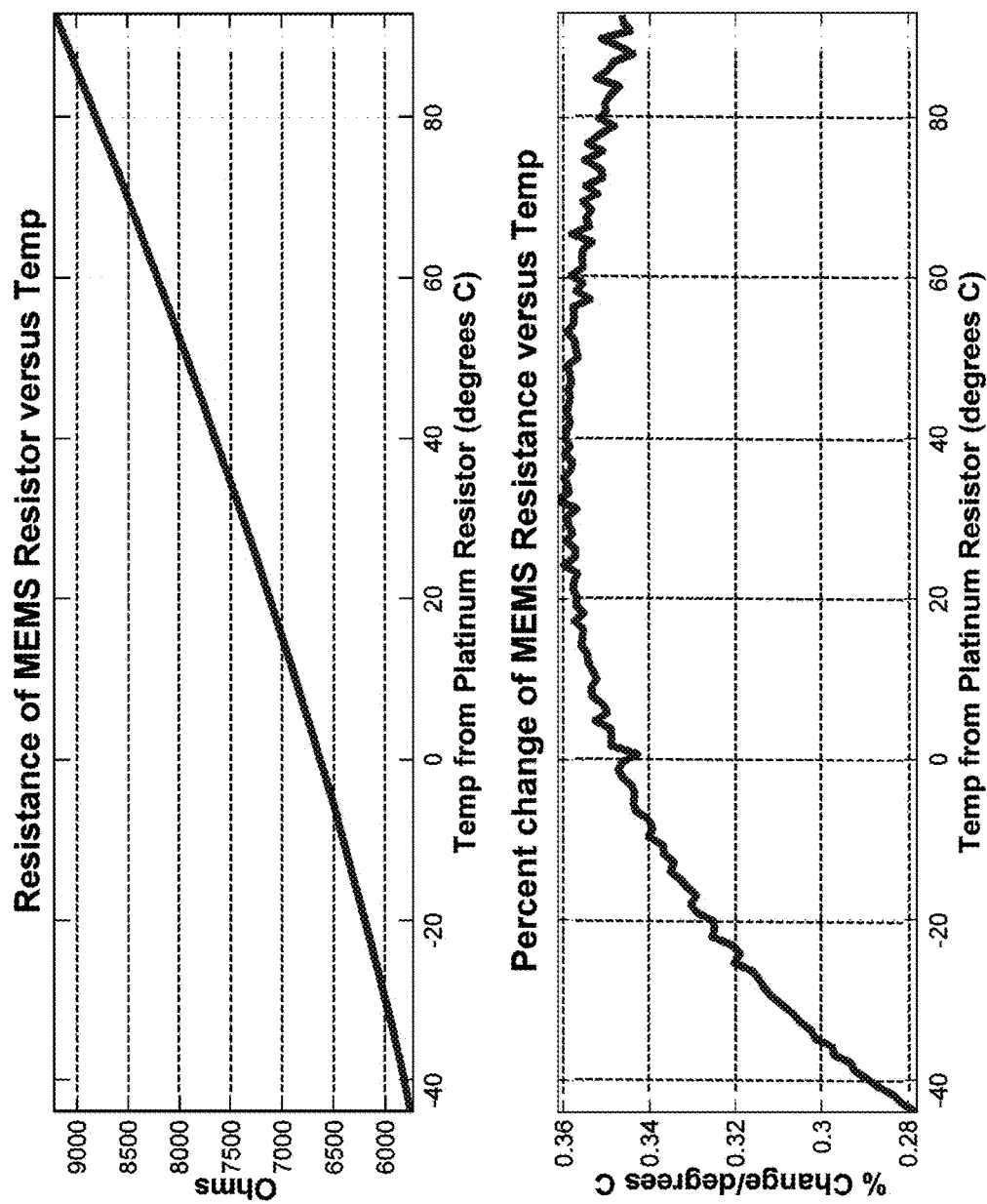
FIG. 3 illustrates exemplary resistance versus temperature characteristics for a MEMS-based resistor, according to certain aspects of the present inventions.

FIG. 3 provides exemplary characteristic of resistance value versus temperature for resistive element $R_{MEMS}$. In this example the nominal value of $R_{MEMS}$ at room temperature is close to 7.5 kiloOhms, and varies roughly between 5.75 kiloOhms and 9.25 kiloOhms across a temperature range of −40 degrees Celsius to 90 degrees Celsius as shown in the top portion of the figure. As indicated by the bottom portion of the figure, the relative change in resistance varies between 0.28 percent and 0.36 percent across the indicated temperature range. Referring to FIG. 2, if we assume an example operating voltage of 0.5V for $V_R$ and $V_C$, then a simple voltage sensitivity analysis is calculated as:

$$\Delta V_R = I_{bias}\Delta R_{MEMS} = \frac{0.5}{R_{MEMS}}\Delta R_{MEMS} = 0.5\frac{\Delta R_{MEMS}}{R_{MEMS}}$$

Assuming a worse case value of $\Delta R_{MEMS}/R_{MEMS}$ is 0.28 percent in this example, a minimum sensitivity of 1400 microVolts per degree Celsius is achieved, which is nearly an order of magnitude higher than a typical bipolar based temperature sensor yielding approximately 180 microVolts per degree Celsius. The sensitivity may be further increased for larger operating voltages for $V_R$ and $V_C$. As such, the relative impact of noise for a resistor based temperature sensor may be much reduced compared to a bipolar design due to its significantly higher temperature sensitivity. While this example is shown for a MEMS-based resistor, similar or better temperatures sensitivities could be achieved for alternative resistor structures made form polysilicon, metal, vias, or other materials.

Aspects of Sensing the Difference in Resistor Values

Figure 4:
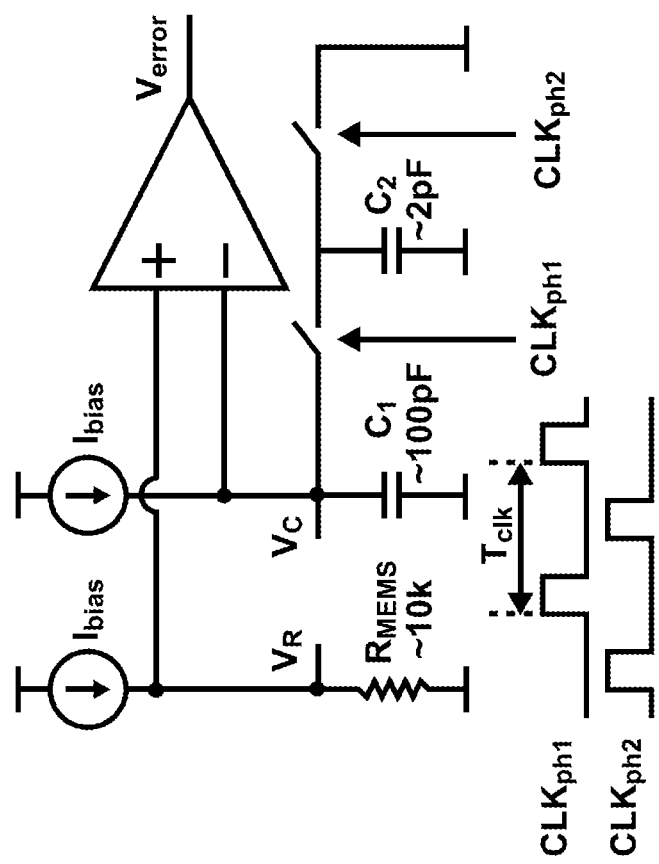
FIG. 4 illustrates an exemplary embodiment of a conceptual view of an analog approach of comparing the MEMS resistor value to the effective resistance of the switched capacitor network.

In the sensing circuitry of the present inventions, the measurement of the difference in $R_{MEMS}$ and $R_{cap}$ takes into account issues of noise, DC offsets, mismatch, and appropriate biasing of analog elements. FIG. 4 illustrates a classical approach to sensing the voltage error of the network shown in FIG. 2 in which a differential amplifier is used to amplify the error in order to reduce the impact of noise sources in circuits that process this error information for the feedback system described earlier.

There are a number of shortcomings when employing the circuitry illustrated in FIG. 4 as the core sensing circuit. In particular, the differential amplifier will have DC offset and $1/f$ noise, and the current sources providing $I_{bias}$ will have mismatch and $1/f$ noise. Traditional chopping techniques may be applied to the differential amplifier in order to mitigate the issues of DC offset and $1/f$ noise. However, while dynamic element matching techniques may be applied to the current sources in order to lower the impact of their mismatch, the $1/f$ noise of the current sources will not be reduced by this technique and will present a bottleneck to performance under the constraint of achieving a low area and low power solution.

Figure 5:
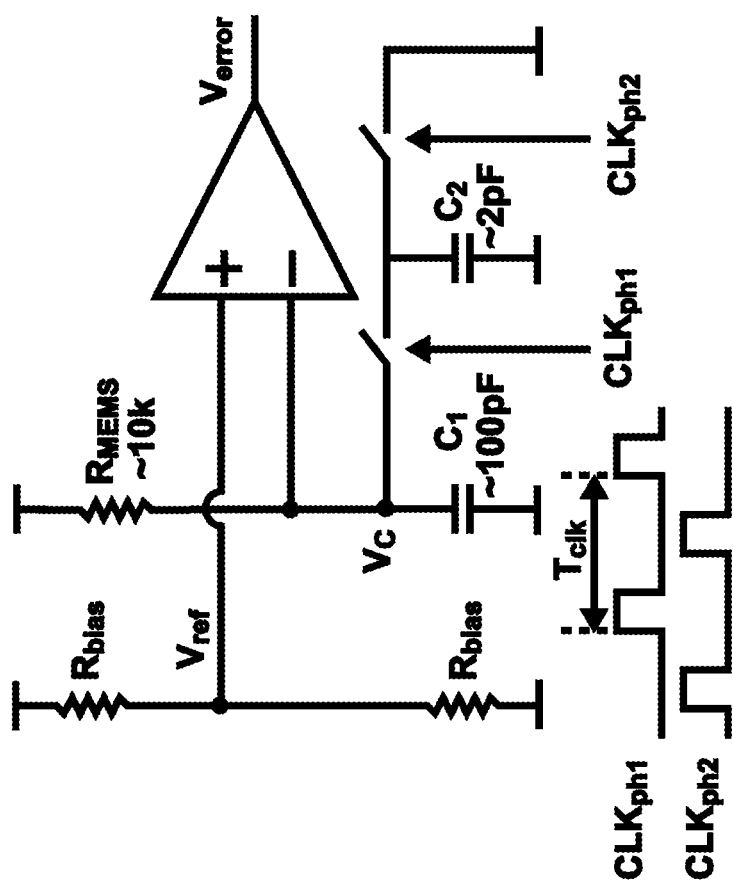
FIG. 5 illustrates an exemplary embodiment of a view of an alternative analog approach of comparing the MEMS resistor value to the effective resistance of the switched capacitor network, according to certain aspects of the present inventions.

To reduce, minimize and/or eliminate the $1/f$ noise of the current sources, we employ a resistor comparison topology shown in FIG. 5. Here we compare $R_{MEMS}$ and $R_{cap}$ by simply placing them in series and then comparing the resulting voltage to a reference voltage divider from the same supply with two resistors of equal value $R_{bias}$. However, this topology may require extra current through the reference voltage divider and may be sensitive to mismatch between the resistors of the voltage divider (i.e., they are unlikely to be exactly equal to each other), which may cause a source of inaccuracy in temperature measurement.

Aspects of the Resistor Comparison Circuit and Technique

Figure 6:
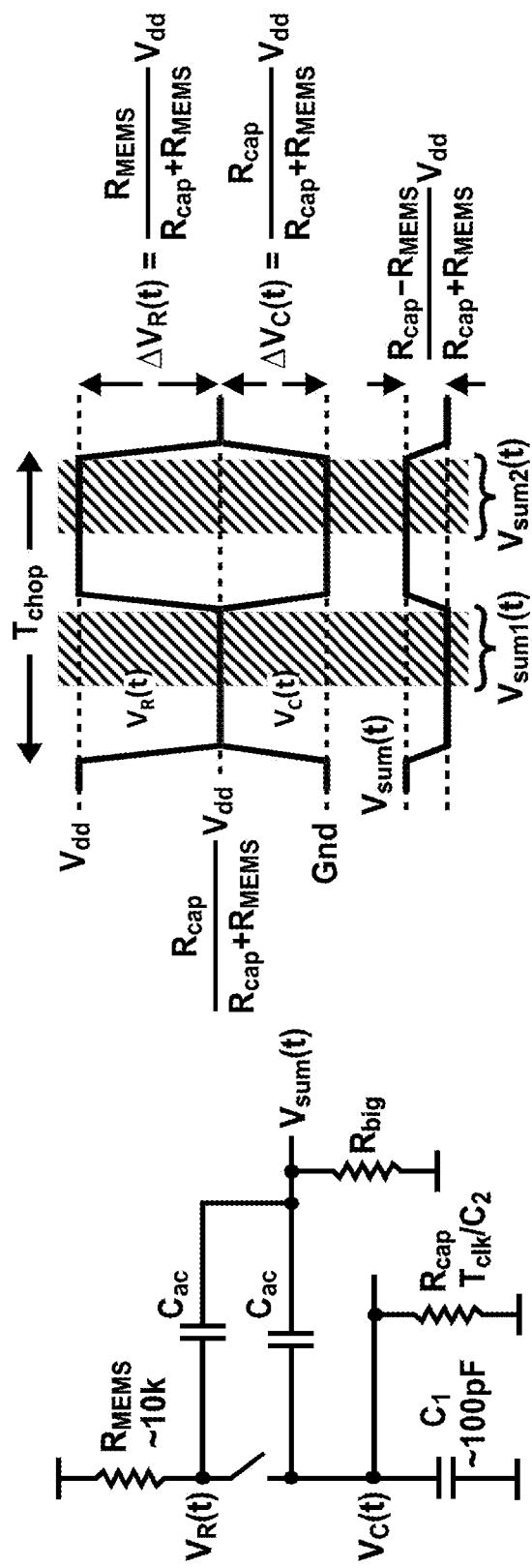
FIG. 6 illustrates an exemplary embodiment of circuitry and techniques to compare the MEMS resistor value with the effective resistance of the switched capacitor network, according to certain aspects of the present inventions.

A significant feature of the resistor comparison circuit, according to at least certain embodiments of the present inventions, is implementing pair-wise measurements at different points in time. FIG. 6 displays an embodiment of comparing $R_{MEMS}$ versus $R_{cap}$.

By way of explanation of the operation of this exemplary embodiment, first consider the case where the switch is open such that $V_R(t)$ settles to $V_{dd}$ and $V_C(t)$ settles to Gnd. When the switch is closed, $V_R(t)$ and $V_C(t)$ will tend to the same voltage value (assuming negligible switch resistance) as determined by the relative values of $R_{MEMS}$ and $R_{cap}$. A key observation is that the relative change in voltage values for $V_R(t)$ and $V_C(t)$ as the switch is enabled will be equal if $R_{MEMS}$ and $R_{cap}$ are equal, and will otherwise be different according to the formula shown in FIG. 6. Note that the above observation is valid even in the presence of non-negligible resistance of the switch since the current flow in $R_{MEMS}$ and $R_{cap}$ will be perfectly matched on average regardless of the switch resistance. The relative change in voltage values can be efficiently captured by placing AC coupling capacitors at the $V_R(t)$ and $V_C(t)$ nodes and then connecting the capacitors to a common summing node, $V_{sum}(t)$. FIG. 6 indicates that the changes in voltage of $V_{sum}(t)$ can be directly mapped to the difference in resistance values between $R_{MEMS}$ and $R_{cap}$.

Using a pairwise comparison of measurements in time tends to substantially reduce the impact of DC offset and 1/f noise in the measurement circuits. This embodiment may lead to a very simple implementation since the information in the signal is fundamentally encoded into pairwise measurements such that analog circuits to follow need not have chopping circuitry embedded in their implementation, and additional pulse biasing techniques may be applied to reduce the impact of noise from current biases, voltage supplied, and resistor feedback networks. These proposed pulse biasing techniques will be addressed more thoroughly in the sections to follow.

Figure 7:
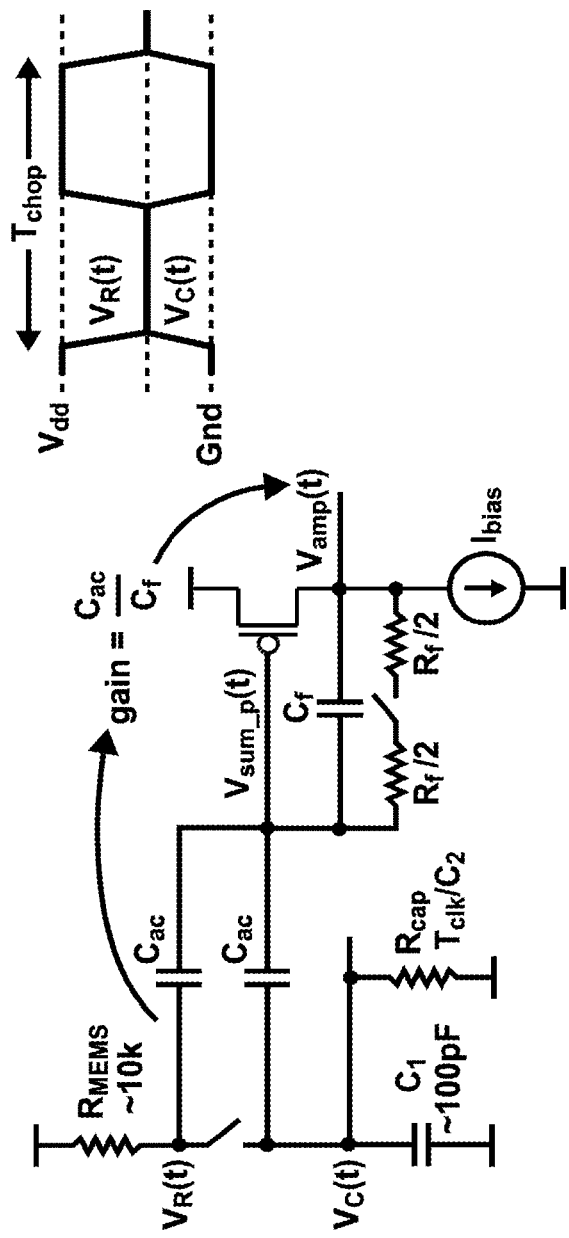
FIG. 7 illustrates an exemplary embodiment of resistor comparison circuitry and technique utilizing a single-ended amplifier, according to certain aspects of the present inventions.

As with the more classical approach discussed earlier, a low noise amplifier is useful in providing gain to the error signal so that noise sources in following stages of the feedback system have less impact. In contrast to the classical approach shown in FIG. 5, a single-ended rather than differential amplifier may be used for the proposed resistor comparison circuit since deviations of the $V_{sum}(t)$ signal are the key source of information rather than comparison of $V_{sum}(t)$ to some other voltage signal. An advantage of using a single-ended amplifier is that its implementation requires fewer transistors than a differential version, which offers advantages when striving for low power and area. As shown in FIG. 7, a common source amplifier provides a simple implementation for achieving gain, and the use of capacitive feedback allows accurate control of that gain as the ratio of $C_{ac}/C_f$. Note that using a PMOS transistor for the critical gain device, as shown in the figure, offers improved 1/f noise in some processes.

Figure 8:
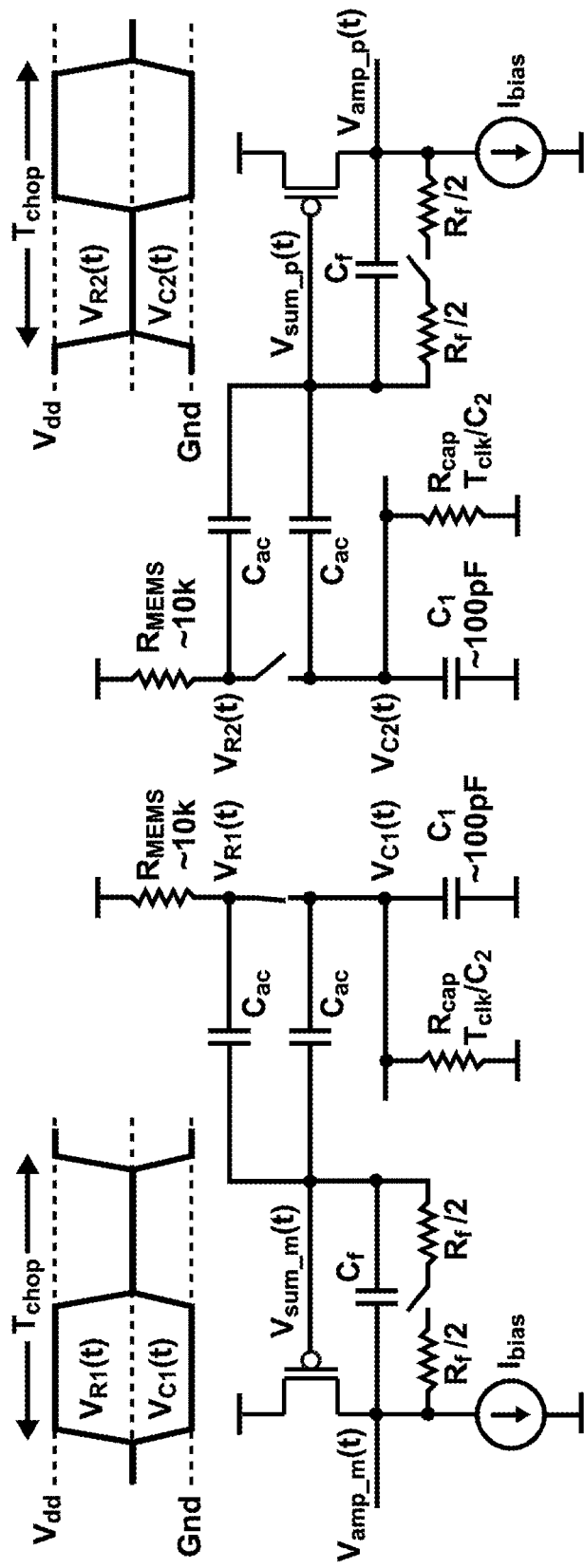
FIG. 8 illustrates an exemplary embodiment of comparison approach with a pseudo-differential topology based on two temperature sensitive resistors, according to certain aspects of the present inventions.

In this embodiment, current flow through the resistor network occurs in a pulsed manner according to when the switch is turned on, which may lead to disturbance on the supply network that couples into other blocks. To reduce such disturbance, we can create a pseudo differential version of the resistor comparison circuit as shown in FIG. 8. In this case, two temperature sensitive resistors are utilized, and the current is switched through them in opposite phasing as shown in the figure. As such, relatively constant current flow may be maintained such that supply disturbances are minimized. However, a negative aspect of this topology is that two temperature sensitive resistors are required, which may have negative implications on area and complexity in some applications.

Figure 9A:
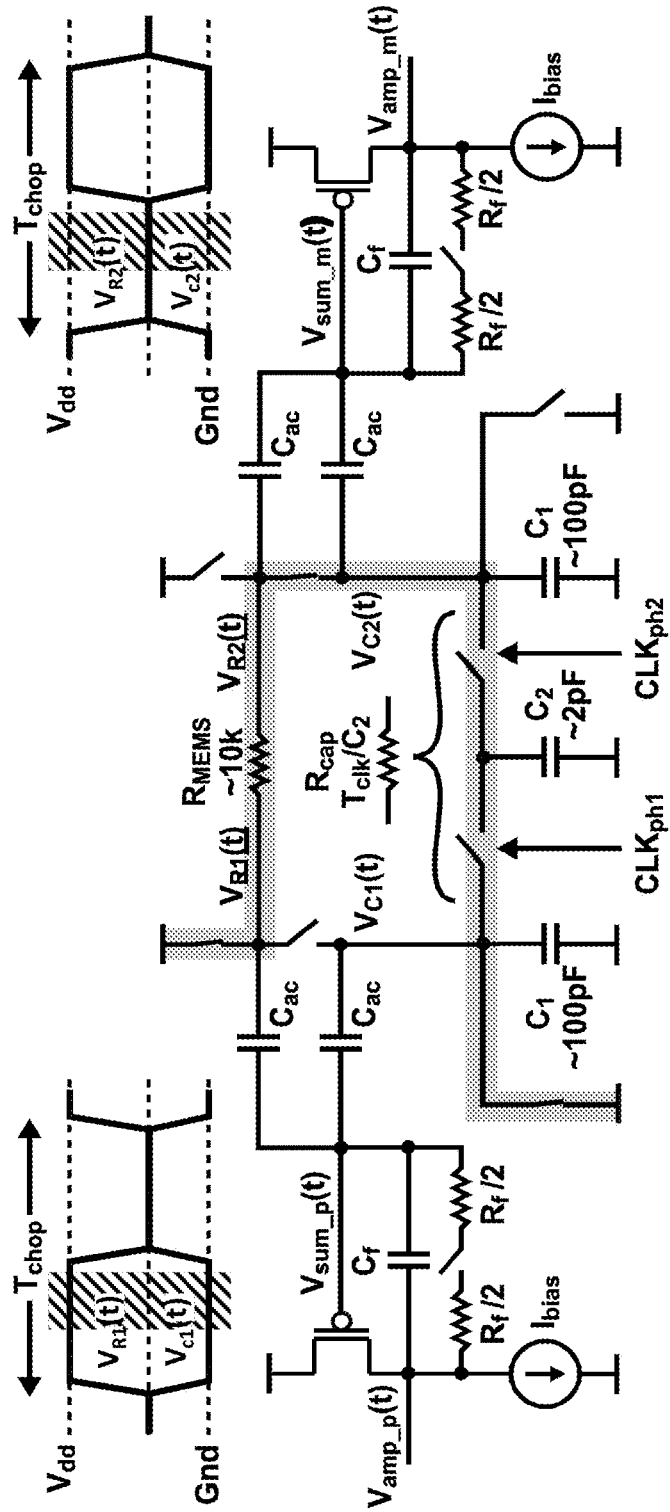
FIGS. 9A and 9B illustrate exemplary embodiments of resistor comparison topology using one temperature sensitive resistor, according to certain aspects of the present inventions.
Figure 9B:
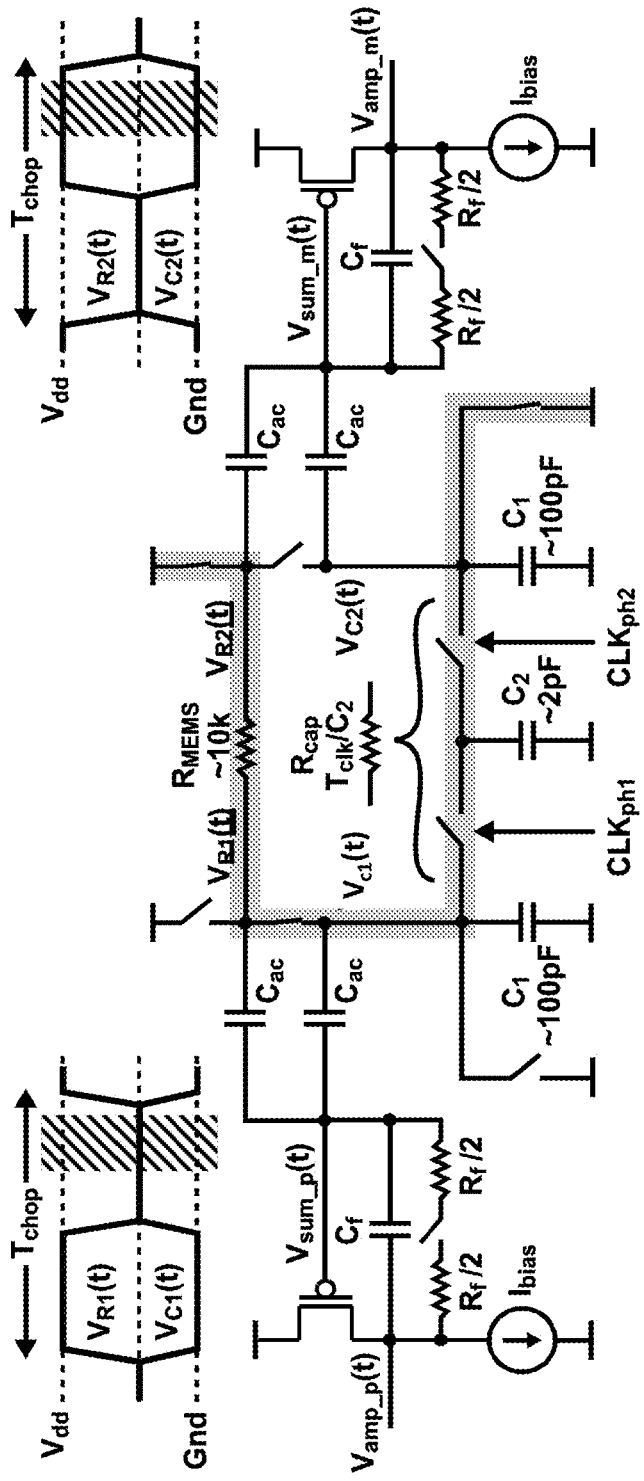

FIGS. 9A and 9B illustrate the resistor comparison embodiments in which one temperature sensitive resistor is employed while still achieving pseudo-differential operation. The shaded portions in the figure illustrate the current path that is enabled for the switch settings corresponding to the two pseudo-differential operating states. As illustrated, the two operating states correspond to opposite current flows through the temperature sensitive resistor, which has the additional advantage of achieving close to zero DC current bias through the resistor and therefore reduces concern of electromigration effects which may cause drift in the temperature sensor readout.

In practice, there will be a finite transient time that occurs when switching the resistor comparison circuit between its two operating states. As indicated by the shaded region in FIGS. 9A and 9B, a key observation time of the output signals should be restricted to a time region in which all transients have settled. This implies that the behavior of the circuit outside of these observation times has no bearing on the final results, so that the performance of the circuit may be robust against issues such as variation of the settling time due to switching.

Aspects of the Exemplary Pulsed Biasing Circuit and Technique

A significant noise benefit may be achieved by taking advantage of the fact that the proposed system evaluates, measures and/or operates on a difference between pairwise measurements, and that the observation, evaluation, sampling and/or measuring windows of those measurements may be confined in time as illustrated by the shaded regions in FIG. 9. In this embodiment, we propose several circuits and techniques to provide such noise reduction from sources such as bias currents, supply voltages, and resistor feedback networks.

Figure 10:
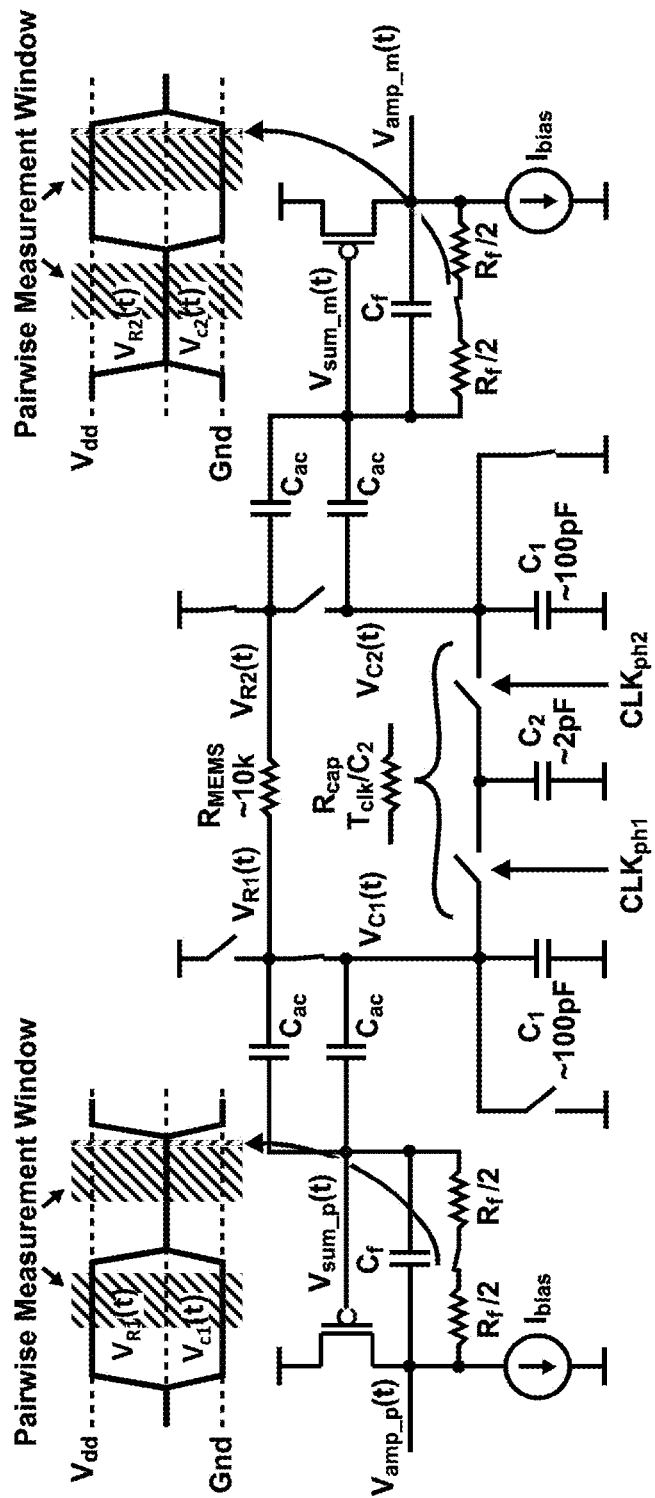
FIG. 10 illustrates an exemplary embodiment of resistor comparison topology wherein in this exemplary embodiment "switches" on feedback resistors of amplifier for a duration after each pairwise measurement cycle to improve noise performance, according to certain aspects of the present inventions.

FIG. 10 illustrates a proposed exemplary technique of pulsing the feedback resistor of the amplifier after the observation, evaluation, sampling and/or measuring window has ended for the second of the pairwise measurements and before the transient that follows from changing the switch settings. By doing so, the noise of the resistor no longer has significant impact on the pairwise measurement comparison. In addition, the effective value of resistance is increased approximately by the ratio of the pulse period of the resistor switch to its on-time, which saves area when trying to achieve a large effective resistance in the feedback path of the amplifier.

Figure 11:
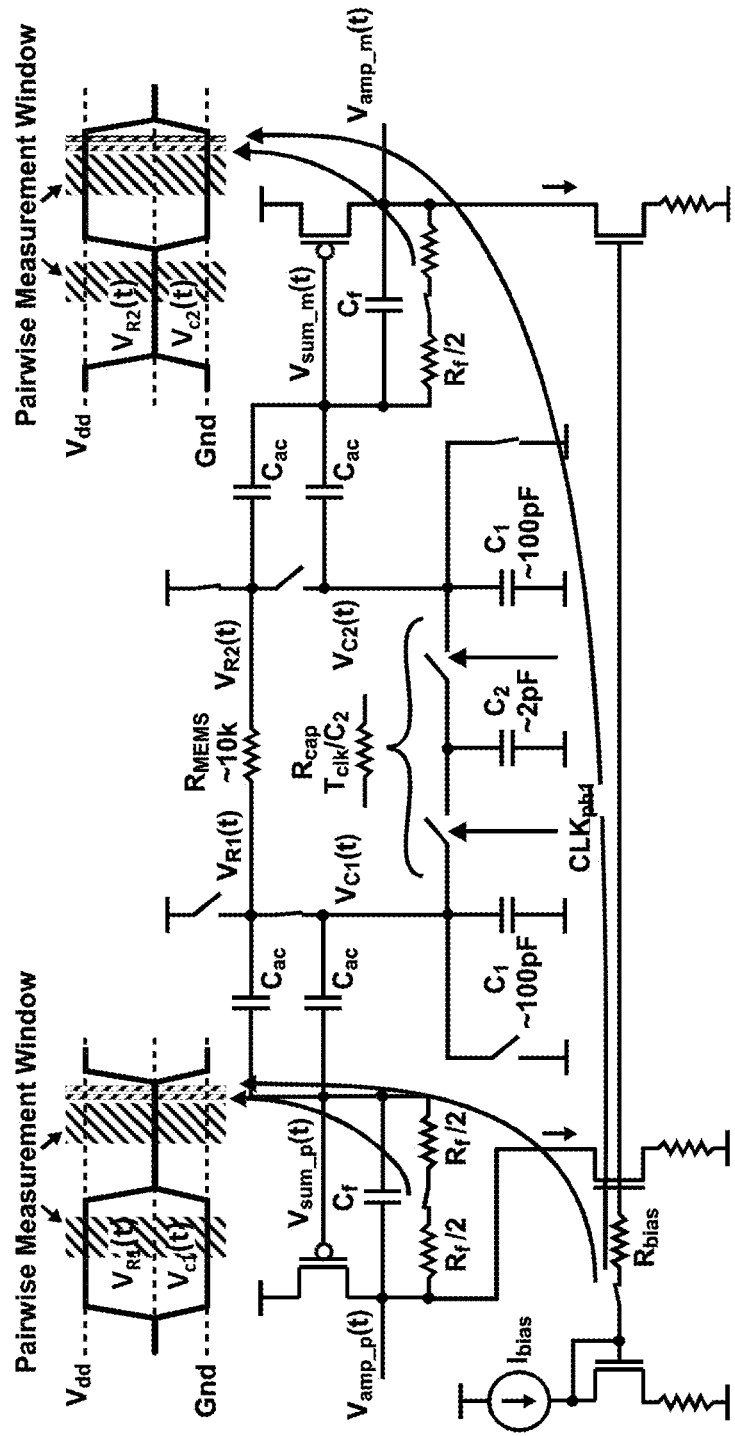
FIG. 11 illustrates an exemplary embodiment of resistor comparison topology, according to certain aspects of the present inventions; wherein in this exemplary embodiment circuitry "samples" the current bias for a duration after each pairwise measurement cycle to improve noise performance.

FIG. 11 illustrates another embodiment including a proposed switching circuitry and technique which is similar to the pulse technique and circuit being applied to the bias current of the amplifiers. In one embodiment, the pulse on-time should occur once per pair-wise measurement at a time outside of the measurement window and when transients occur due to a change in the switch settings. To reduce or minimize coupling issues, it may be advantageous to place the pulse on-time of the bias current at a non-overlapping point in time relative to the pulse on-time of the resistor switch, as indicated by the shaded regions in FIG. 11.

Figure 12:
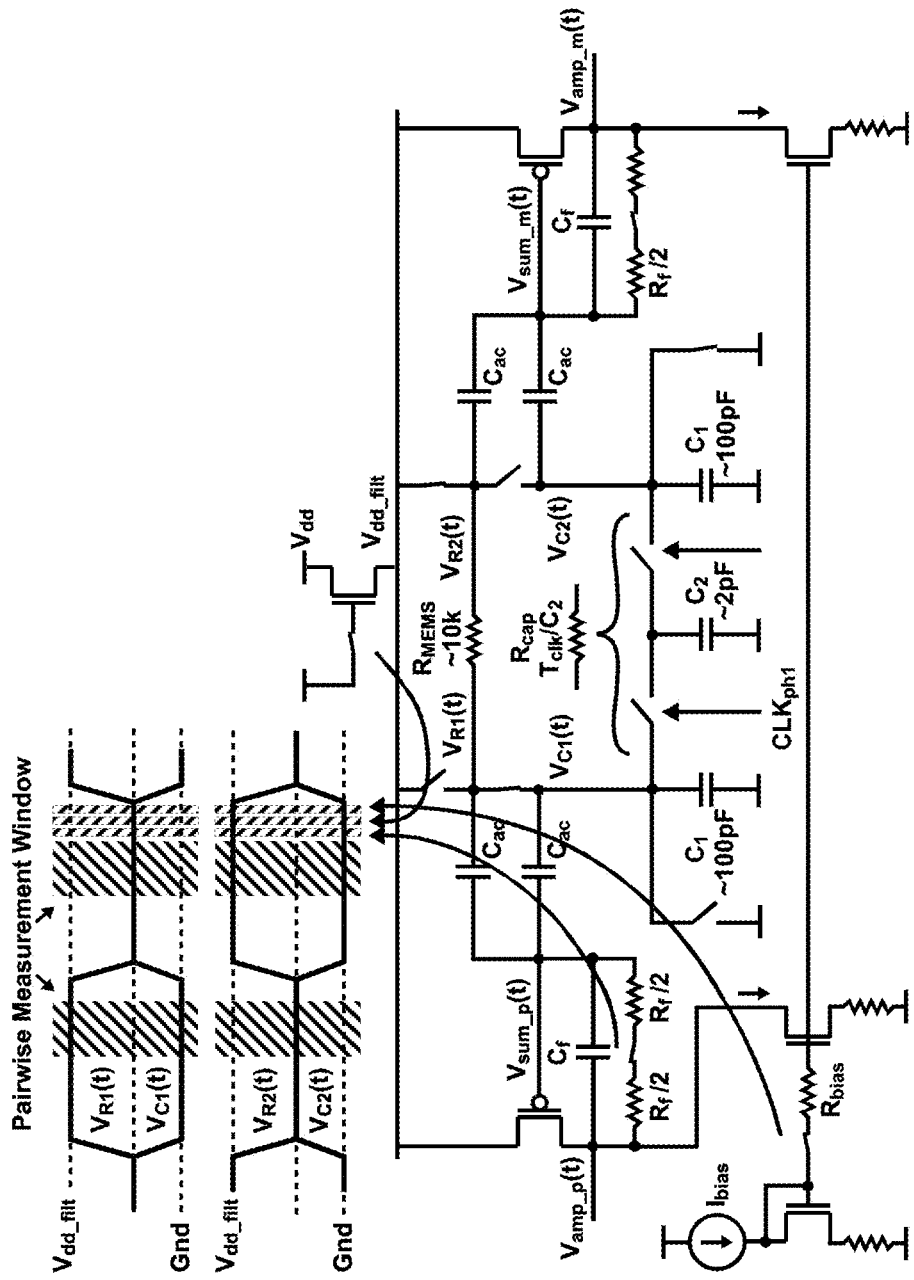
FIG. 12 illustrates another exemplary embodiment of a proposed switching circuitry and technique according to certain aspects of the present inventions, wherein in this exemplary embodiment circuitry and techniques "sample" the gate of a transistor (in this illustrated exemplary embodiment, an NMOS transistor) to improve voltage supply noise performance of temperature to digital resistor comparison circuits.

FIG. 12 illustrates another embodiment of a proposed switching circuitry and technique implementing a similar pulse technique being applied to the voltage supply of the amplifiers. In this embodiment, a native NMOS device is used to isolate the certain circuitry from the main voltage supply, $V_{dd}$, by pulsing its gate. Again, the pulse on-time should occur once per pair-wise measurement at a time outside of the measurement window and when transients occur due to a change in the switch settings. To minimize coupling issues, it may be advantageous to place the pulse on-time of NMOS gate, the bias current, and the resistor switch at non-overlapping times as indicated by the shaded regions in the figure.

Aspects of the Exemplary Temperature Sensor Architectures and Techniques

Figure 13:
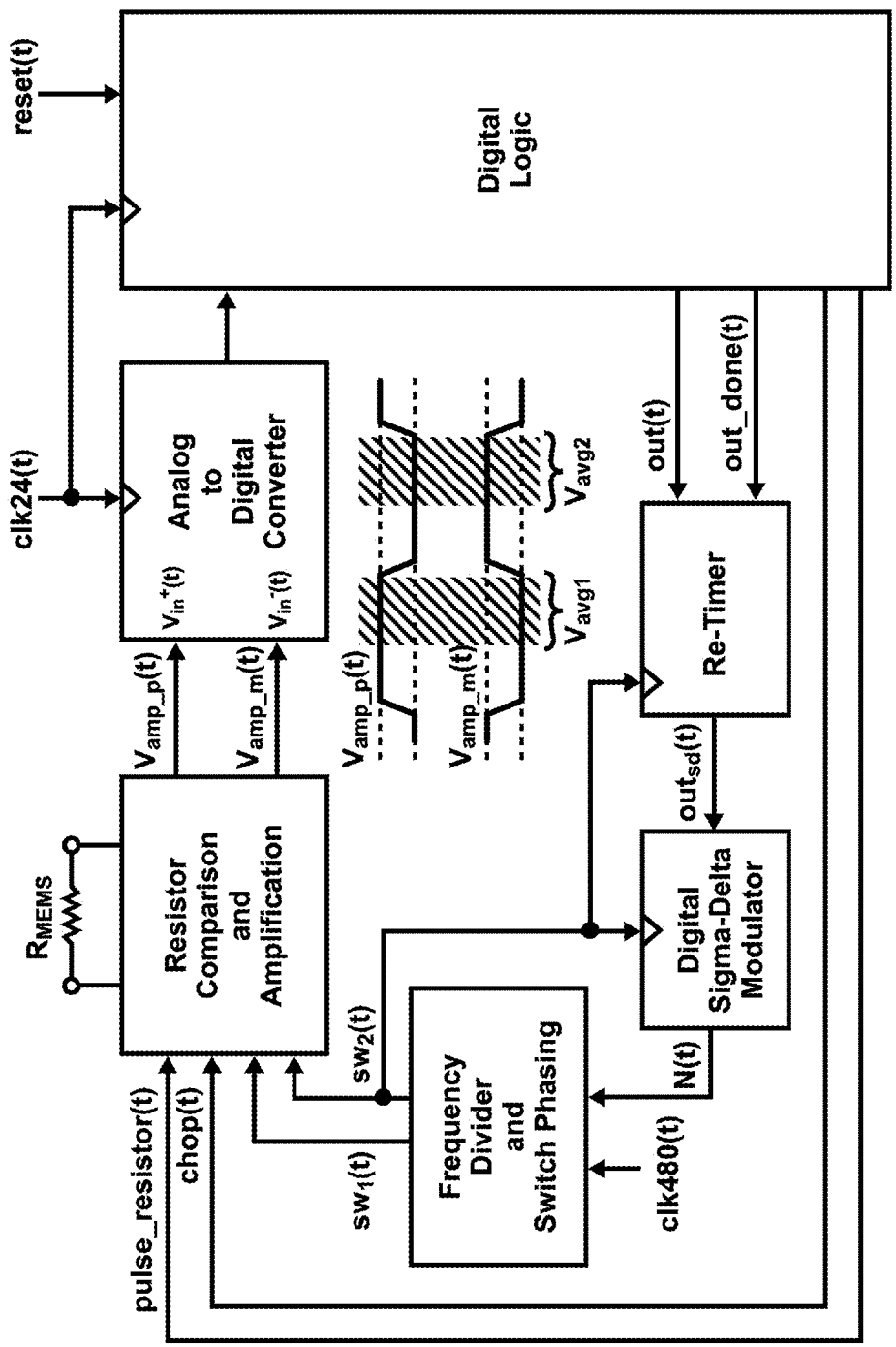
FIG. 13 illustrates an exemplary block diagram of temperature sensor architecture implementing a digital implementation, according to certain aspects of the present inventions.

FIG. 13 shows exemplary architecture of temperature to digital converter circuitry (TDC) in which the resistor comparison circuit and amplifier is embedded or incorporated within a feedback loop. This embodiment presents a highly digital configuration, which provides many advantages in terms of simplifying the design and verification of the overall TDC structure, achieving compact area with advanced CMOS processes, and/or providing a high degree of configurability. The analog output of the resistor comparison and amplification stage is converted into a digital sequence by an analog to digital converter (ADC), and that digital sequence is processed by digital logic to, for example, properly set the switching frequency of the switched capacitor network which controls the effective reference resistance within the resistor comparison circuit given a selected $C_2$ value (see FIG. 12). In a certain embodiment, the effective reference resistor of the switched capacitor network automatically tracks the temperature sensitive resistor such their values will match each other across a wide temperature range. As such, the output of the TDC may be considered the digital control value for the reference resistor, labeled as out(t) in FIG. 13.

As shown in FIG. 13, the switching frequency of the switched capacitor network is most directly set by a frequency divider whose input is a clock waveform, clk480(t), with reasonably high frequency and whose frequency divide value, N(t), is controlled by a digital Sigma-Delta modulator (also known as a "Delta-Sigma modulator"—hereinafter identified as a "Sigma-Delta" or "sigma delta" modulator). In effect, the combination of the frequency divider and Sigma-Delta modulator act as a digital-to-frequency converter which enables precise control over a wide range of the effective resistance value of the switched capacitor network, $R_{cap}$. The effective resistance of the switched capacitor network may be characterized or described to a first order as:

$$R_{cap} = \frac{avg\{N(t)\}}{freq\{clk480(t)\} \cdot C_2} = \frac{out_{sd}(t)}{freq\{clk480(t)\} \cdot C_2} = \frac{out(t)}{freq\{clk480(t)\} \cdot C_2}$$

where $out_{sd}(t)$ is the input to the Sigma-Delta modulator that, in turn, sets the average value of the dithered N(t) signal that controls the instantaneous divide value of the frequency divider.

In this embodiment, $out_{sd}(t)$ is a retimed version of the out(t) signal coming from the digital logic. Note that retiming is advantageous here because the input to the Sigma-Delta modulator is clocked by the frequency divider output (whose instantaneous frequency varies), while the digital logic is preferably clocked at a consistent frequency by clk24(t) to simplify its design and timing requirements. In order to facilitate the re-timing process, the digital logic outputs an out_done(t) signal which signals when the out(t) signal has changed value and has a stable bit pattern which may be sampled by the re-timer circuit.

With continued reference to FIG. 13, the frequency divider block includes switch phasing circuits that generate non-overlapping clocks for the switched capacitor switches as indicated in FIG. 5. The non-overlapping clocks facilitate operation of the switched capacitor circuit.

As mentioned earlier, out(t) would generally be considered the overall output of the TDC since it represents a digital value of the temperature sensitive resistor assuming suitable and/or proper tracking of the effective resistance of the switched capacitor network to its value. This is seen by the expression:

out(t)=freq{clk480(t)}·$C_2$·$R_{cap}$≈freq{clk480(t)}·$C_2$·$R_{MEMS}$ which assumes $R_{cap}$ suitably and/or properly tracks $R_{MEMS}$ due to proper operation of the feedback loop.

Note that FIG. 13 is representative of the feedback circuitry and technique to achieve or provide tracking between the temperature sensitive resistor, $R_{MEMS}$, and the effective resistance of the switched capacitor network, $R_{cap}$. An advantage of this topology is that it is highly digital in nature and should be fairly straightforward to design, but other embodiments may be employed to enable $R_{cap}$ to track $R_{MEMS}$, and such other embodiments are intended to fall within the scope of the present inventions.

Aspects of the Exemplary VCO-Based ADC Circuitry and Techniques

Figure 14:
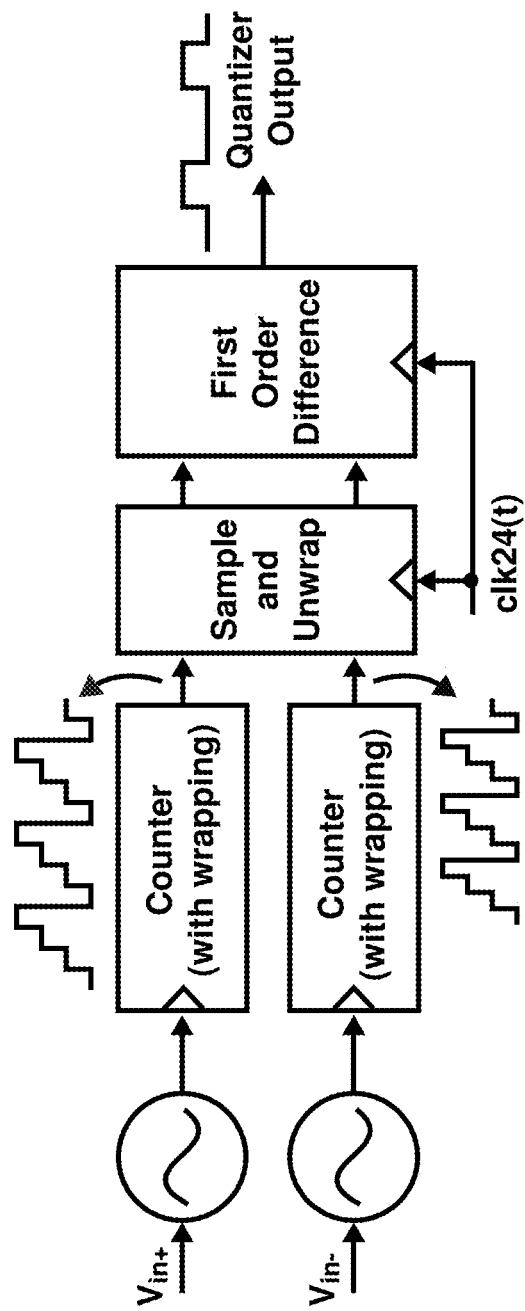
FIG. 14 illustrates an exemplary embodiment of a VCO-based quantizer circuit to implement the analog-to-digital conversion operation of the feedback circuitry for temperature to digital converter circuitry, according to certain aspects of the present inventions.

FIG. 14 illustrates an analog-to-digital converter (ADC) that uses voltage-controlled ring oscillators (VCO) to convert an input analog voltage into a digital value. In this embodiment, a pseudo-differential approach is used in which the output digital code corresponds to the difference between two input voltages, $V_{in}^+$ and $V_{in}^-$. Here the VCO circuitry outputs a periodic waveform whose frequency varies with their input voltage, and counters are used to keep track of the edge counts from each VCO output. By sampling the counter output values by the clk24(t) signal and then comparing the relative difference in edge counts that occurred during the clk24(t) period, a digital output is achieved that corresponds to the difference in the voltage input values. An advantage of using the counters is that the sampling operation may be performed at a lower frequency without losing information, which may be advantageous for achieving low power operation. Note that since the sampler evaluates the absolute count value from each counter (assuming it keeps track of wrapping effects), a first order difference operation is used to determine the relative difference in edge counts that occurred during the clk24(t) period.

An advantage of using this approach for the TDC is that it yields a highly digital implementation for the ADC with first order noise shaping of the quantization noise (see, G. Taylor, I. Galton, "A Mostly-Digital Variable-Rate Continuous-Time Delta-Sigma Modulator ADC," *IEEE Journal of Solid-State Circuits*, vol. 45, no. 12, pp. 2634-2646, December 2010). Unlike other approaches in which great effort was required to achieve high linearity of the ADC (Id.), proper design of the TDC feedback system leads to zero steady-state error between $V_{in}^+$ and $V_{in}^-$ coming into the ADC so that nonlinearity of the ADC characteristic is not of concern (i.e., you only exercise a very narrow input range of the ADC under steady-state conditions). A similar use of the VCO-based quantizer for an ADC only circuit was proposed in J. Hamilton, S. Yan, T. R. Viswanathan, "A Discrete-Time Input Delta-Sigma ADC Architecture Using a Dual-VCO-Based Integrator," *IEEE Transactions on Circuits and Systems II: Express Briefs*, vol. 57, no. 11, pp. 848-852, November 2010.

Embodiments of Digital Logic Circuitry and Techniques

Figure 15:
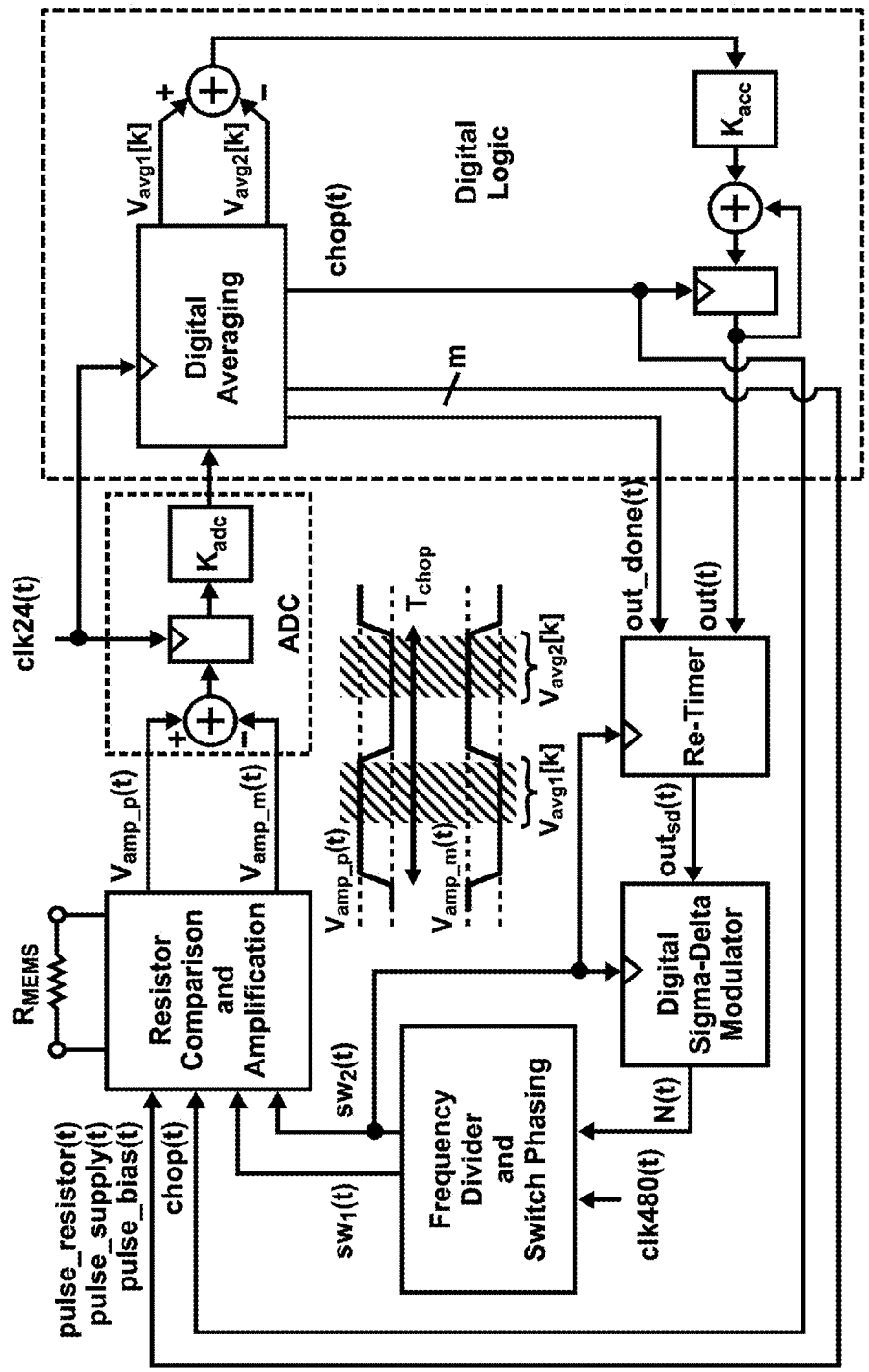
FIG. 15 illustrates an exemplary block diagram of a digital logic circuit having feedback in temperature to digital converter circuitry, according to certain aspects of the present inventions.

FIG. 15 provides further details of a digital logic embodiment that that may be employed to provide a feedback path for tuning the effective resistance of the switched capacitor network. Here we provide a simple model of the ADC as taking the difference between the output voltages of the resistor comparison and amplifier circuits as well as sampling and scaling the difference signal by a gain factor, $K_{adc}$. Assuming a VCO-based quantizer is used for the ADC, $K_{adc}$ will be a function of the voltage-to-frequency characteristic, i.e., $K_v$, and output frequency of the ring oscillators as well as the sample period of the clk24(t) signal. The digital logic takes the digital output sequence from the ADC output and determines the average value within two measurement windows per chop(t) period, $T_{chop}$, which are labeled as $V_{avg1}[k]$ and $V_{avg2}[k]$ in the figure. At each rising edge of the chop(t) signal, $V_{avg1}[k]$ and $V_{avg2}[k]$ are subtracted, scaled by the gain factor $K_{acc}$, and then added to an accumulator output in order to produce the output signal out(t). Note that out(t) is the overall output of the TDC and corresponds to a discrete-time process, so that out(t) would perhaps be better notated as out[k] but is not done so in order to retain consistency with notation in other parts of this document. Since $K_{acc}$ is a digital scale factor, it is useful to make it adjustable in order to allow support of different closed loop bandwidths of the feedback loop, which has benefits for insuring stability of the feedback over a wide variety of analog parameter variations in the feedback loop. Also, note that additional digital processing such as extra filtering could also be added to the feedback system if needed; for the proposed prototype application, extra filtering was not necessary.

As mentioned above, it may be advantageous to pulse the resistor, voltage supply, and current bias within the resistor comparison circuit in a non-overlapping manner relative to each other and the measurement windows in order to improve the noise performance of the TDC. In addition, it may be advantageous to pulse elements within the ADC such as its bias current and voltage bias. In the example digital logic shown in FIG. 15, in one embodiment, such non-overlapping pulses may be generated by the digital averaging circuit that runs off the clk24(t) signal using common digital design techniques.

The steady-state behavior of the feedback system shown in FIG. 15 may be modeled using linear system analysis such that its transient response may be approximated as a sum of exponentials. The benefit of achieving behavior that is effectively linear is that the resulting transient response is consistent and straightforward to analyze over a variety of conditions. However, during initial startup, the behavior will, in general, not be linear due to the fact that the ADC will often have limited range and therefore saturate when a large error is present between the temperature sensitive resistor and effective resistance of the switched capacitor network. Saturation of the error signal is common to analog systems, and is referred to as slew rate behavior. In general, a slew rate limited system will experience a transient response that corresponds to a ramp until the error is small enough to remove saturation in the error signal, at which point the system behavior becomes linear so that the transient response corresponds to a sum of exponentials. In general, a slew rate limited system experiences a slower transient response than would be predicted by a linear analysis based on steady-state conditions.

Figure 16:
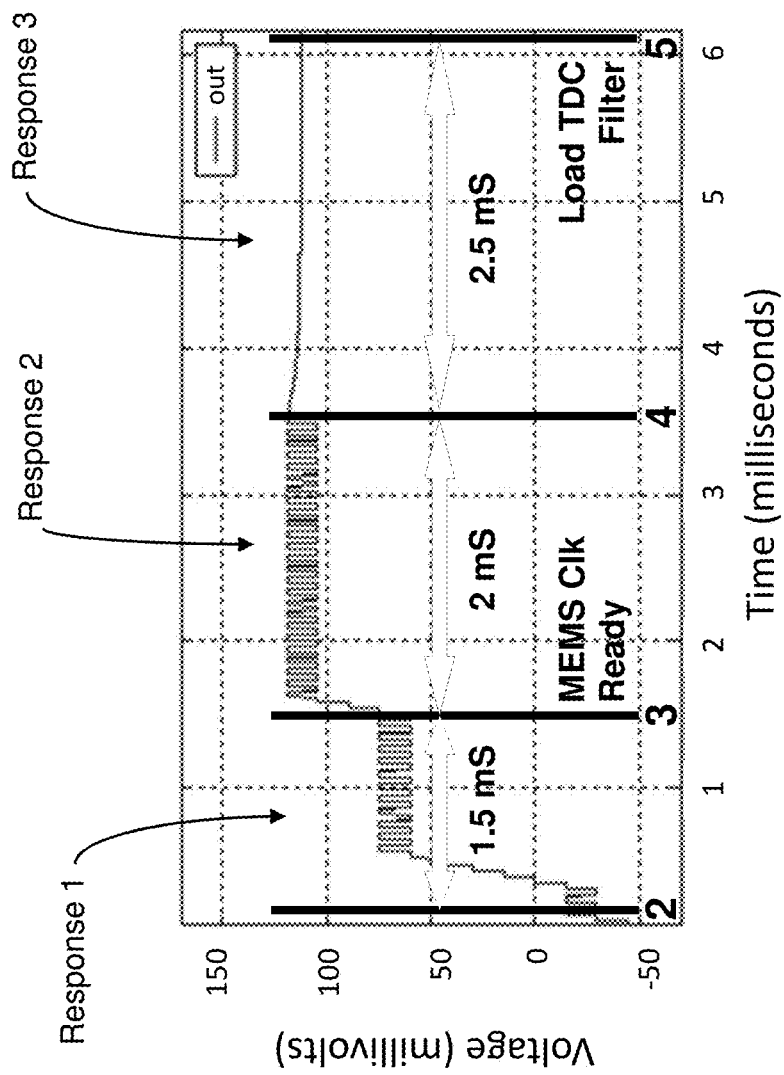
FIG. 16 illustrates an exemplary output response of temperature to digital converter circuitry (have exemplary characteristics) for a MEMS-based oscillator application, according to certain aspects of the present inventions, wherein, three types of responses may be generally described including a "bang-bang" behavior is utilized for the first part of the transient response for first an LC (Response 1), MEMS-based reference (Response 2), and linear behavior is switched to at the end of the transient response (Response 3)

In one embodiment, it may be advantageous to implement gear-shifting approaches such that the feedback system behavior is altered dynamically during the initial transient response of the system, for example, to improve the transient time during initial startup. Such gear-shifting approaches are commonly applied to a wide variety of systems, and there are many techniques and circuits to provide a faster transient time with optimized performance of steady-state dynamics. One such approach is illustrated in FIG. 16 in which the $K_{acc}$ block in FIG. 15 is changed from a gain factor to a bi-state output that is simply a positive or negative value depending on whether its input is positive or negative, respectively, during initial transient conditions. As shown in FIG. 16, this leads to a transient response that exhibits bang-bang control behavior during the time that the $K_{acc}$ block implements bi-modal behavior, and then linear (i.e., exponential response) behavior when the $K_{acc}$ block reverts to being a gain element.

FIG. 16 illustrates subtle issues in startup that occur for a MEMS-based oscillator application due to limitations on providing a frequency reference at startup. In this embodiment, the MEMS-based oscillator is used during steady-state operation as the frequency reference that directly or indirectly (i.e., through a clock multiplier or frequency divider) feeds the input of the TDC frequency divider, clk480(t), as well as the other system clocks shown in FIG. 15. However, in certain embodiments, the MEMS-based frequency reference may not immediately be available at the initial stages of startup, and therefore an alternative frequency reference may be used such as, for example, an on-chip LC oscillator. Since the LC oscillator based frequency reference will have a different frequency from the MEMS-based frequency reference, the transition between these two frequency references will cause a change in the TDC output. Such behavior is illustrated in FIG. 16, where an initial bang-bang settling behavior is selected when using the LC oscillator frequency reference and for some set time after switching over to the MEMS-based frequency reference. As the figure reveals, the bang-bang behavior allows fast initial acquisition when using the LC oscillator, and fast response to the change in frequency that occurs when switching to the MEMS frequency. Once sufficient time is allowed for the bang-bang system to "settle", the feedback behavior is changed from bang-bang to linear, at which point the output of the TDC settles in an exponential manner. Note that it may advantageous to make the time allocated for each operating mode of the TDC configurable such that the startup time may be minimized through calibration.

During steady-state operation of the TDC feedback system, the linear behavior of the system allows straightforward noise analysis in the form of a noise spectrum or transient noise behavior. In general, various noise sources will be encountered in the system shown in FIG. 15, including phase noise of the VCO-based quantizer, frequency reference, and clock multiplier, thermal and 1/f noise of the resistor comparison and amplification network, jitter in the frequency divider, and quantization noise due to the analog-to-digital operation and any places where digital quantization occurs. Such noise analysis should be straightforward for those skilled in the art of designed mixed-signal systems that combine continuous-time analog circuits and discrete-time analog and digital circuits.

In addition to analytical analysis of the TDC, time-domain simulation analysis may also provide a useful method to check both the dynamic and noise performance of the TDC. Such a model may be implemented in various simulation frameworks such as CppSim, Matlab, Simulink, Spice, Verilog, or VHDL.

Figure 17:
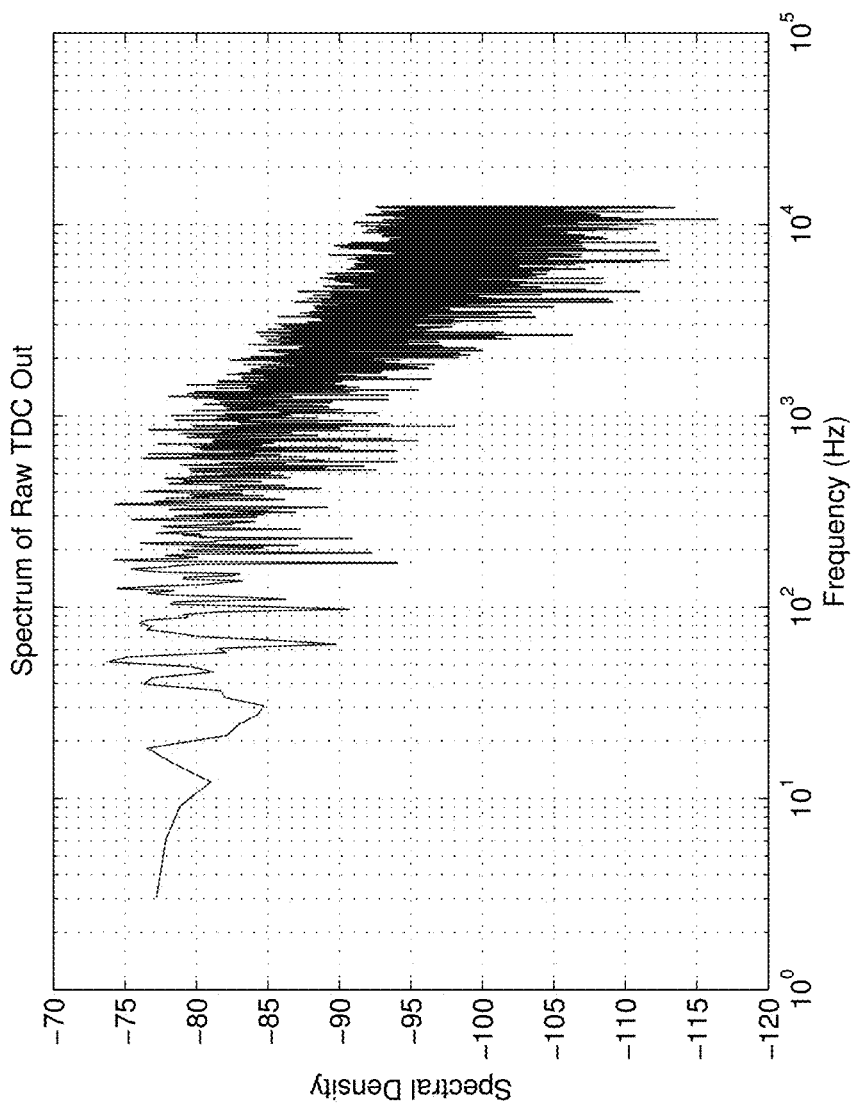
FIG. 17 illustrates a simulated output spectrum from temperature to digital converter circuitry generated using a CppSim system simulation model.

FIG. 17 shows the simulated output spectrum from a system level simulation model of the TDC which models its dynamics and noise behavior using the CppSim system simulator. In this case, we see that the noise has a lowpass filter shape in frequency, where the bandwidth of the noise spectra corresponds to the bandwidth of the closed loop TDC feedback dynamics. In this case, a bandwidth of approximately 1 kHz is observed assuming the chop(t) signal has a frequency of $1/T_{chop}=25$ kHz, clk24(t) has a frequency of 24 MHz, and clk480(t) has a frequency of 480 MHz. If $K_{acc}$ were set to a lower value, the closed loop feedback bandwidth would reduce and generally yield noise spectra with lower bandwidth, as well. Vice versa, if $K_{acc}$ were set to a higher value, the close loop bandwidth, and therefore noise spectra bandwidth, would generally increase; however, stability issues could occur if $K_{acc}$ were set too high.

While the above discussion indicated a direct relationship between the bandwidth of the closed loop feedback of the TDC and its output noise spectra, one should note that the noise spectra may be reduced in bandwidth while maintaining the same closed loop feedback bandwidth by feeding the TDC output into digital filter(s) outside of the feedback loop. In such a case, there is a tradeoff between the overall tracking ability of the TDC versus noise reduction, where lower filter bandwidth allows improved noise reduction at the expense of reduced tracking ability. However, by placing the additional digital filter(s) outside of feedback loop, the TDC may achieve a faster startup time through the wider closed loop bandwidth that is enabled and the fact that digital filters may be pre-loaded to reduce the time of their initial transient response.

Embodiments of an Exemplary VCO-Based Quantizer

This section provides further details of embodiments of a VCO-based quantizer within the feedback loop of the TDC. The circuit details provided here are exemplary; note that other ADC structures/embodiments may be implemented, and different architectures/embodiments for the VCO-based quantizer may be employed for different applications.

Figure 18:
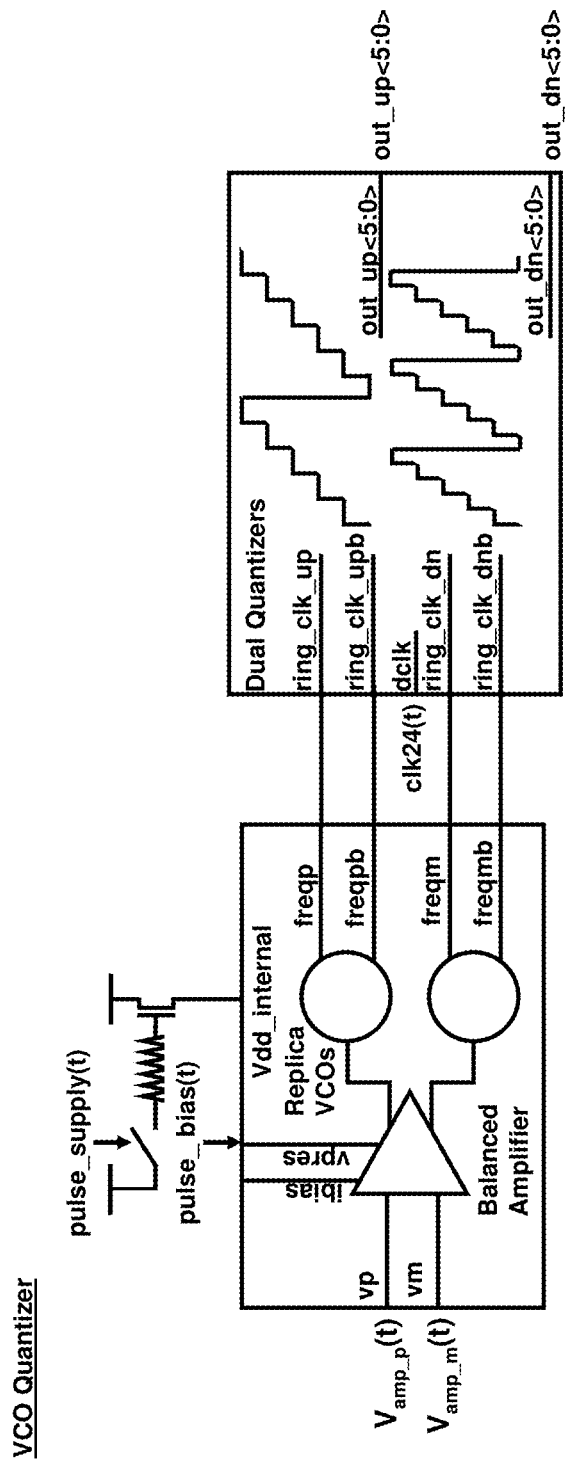
FIGS. 18 and 19 illustrate exemplary embodiments of a VCO-based quantizer circuit, including differential amplifier and two ring oscillators, to implement the analog-to-digital conversion operation of the feedback circuitry for temperature to digital converter circuitry, according to certain aspects of the present inventions.

FIG. 18 illustrates a block diagram of an exemplary VCO-based quantizer embodiment, which consists of a differential amplifier feeding into two ring oscillators whose outputs are fed into digital logic that counts the number of transitions per period of the clk24(t) input signal. As indicated by the drawing, the transition counts are designated as out_up and out_dn, corresponding to the two different ring oscillator outputs. In general, the transition counts will increase monotonically until they hit a maximum value, at which point they wrap around in value and continue their monotonic increase in value. A higher frequency for a given ring oscillator will lead to a faster ramp in its transition count, such that the time duration between wrapping events is a function of ring oscillator frequency, clk24(t) frequency, and number of bits within the counter circuits. Assuming that these parameters are set such that at least two counter values occur between wrapping events across all ring oscillator frequencies, the output of the counters may be readily unwrapped by digital logic that operates on the out_up and out_dn digital signals so that the difference in count values between ring oscillator transitions may be computed. The difference in count values is the key output signal of the VCO-based quantizer which is utilized by the TDC feedback loop. As such, we see that proper setting of the ring oscillator frequency, clk24(t) frequency, and number of bits within the counters is an important design consideration in order to ensure that the unwrapping operation is simple and robust across process and temperature variations. Similar to how the comparison circuits in FIG. 12 are supplied with voltage by a pulsed NMOS device, the balanced amplifier and replica VCOs are also provided voltage by their own pulsed NMOS device. This improves noise isolation from the VCO quantizer to the sensitive comparison circuits as well as supply noise suppression into the quantizer.

Figure 19:
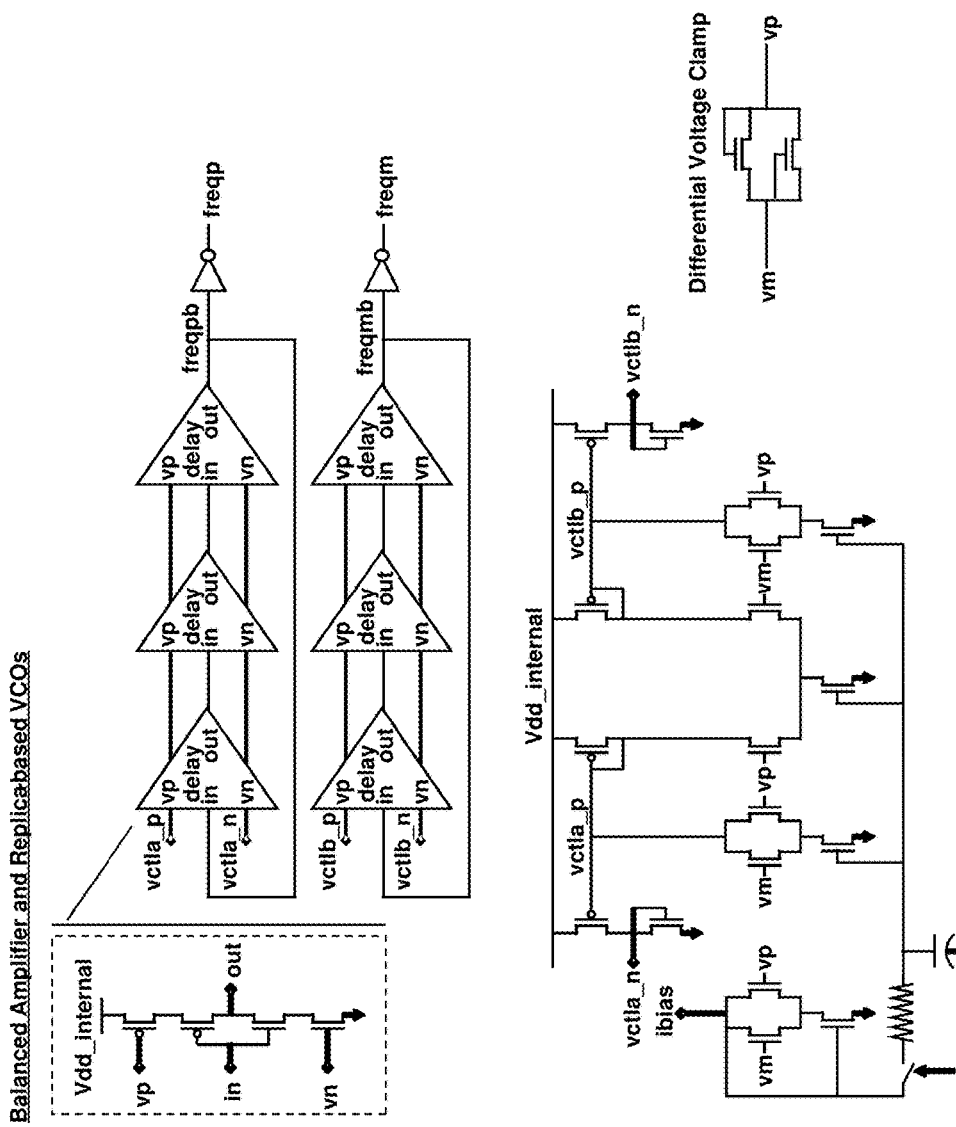

FIG. 19 illustrates a simplified circuit diagram of the differential amplifier and ring oscillator structures. The differential amplifier consists of a CMOS differential pair that directs bias current into left or right current mirrors whose outputs are fed into the NMOS and PMOS devices of the ring oscillator delay stages. This ensures that the current being pulled from the supply is relatively constant regardless of vp-vm. In those embodiments where the ring oscillator remains oscillating across all (or substantially all) input conditions, current bleeder circuits may be included in the current mirrors to achieve a minimum bias current flowing through them. As mentioned earlier in this document, the VCO-based quantizer may employ the bias pulsing that is used in the resistor comparison circuit and amplifier to lower the impact of bias noise. In this case, the vpres signal in FIG. 19 represents the pulse switch, where the pulsing occurs once every chop(t) period as discussed previously in this document. The differential voltage clamp limits the maximum large-signal differential amplitude that is presented to the balanced amplifier.

Figure 20:
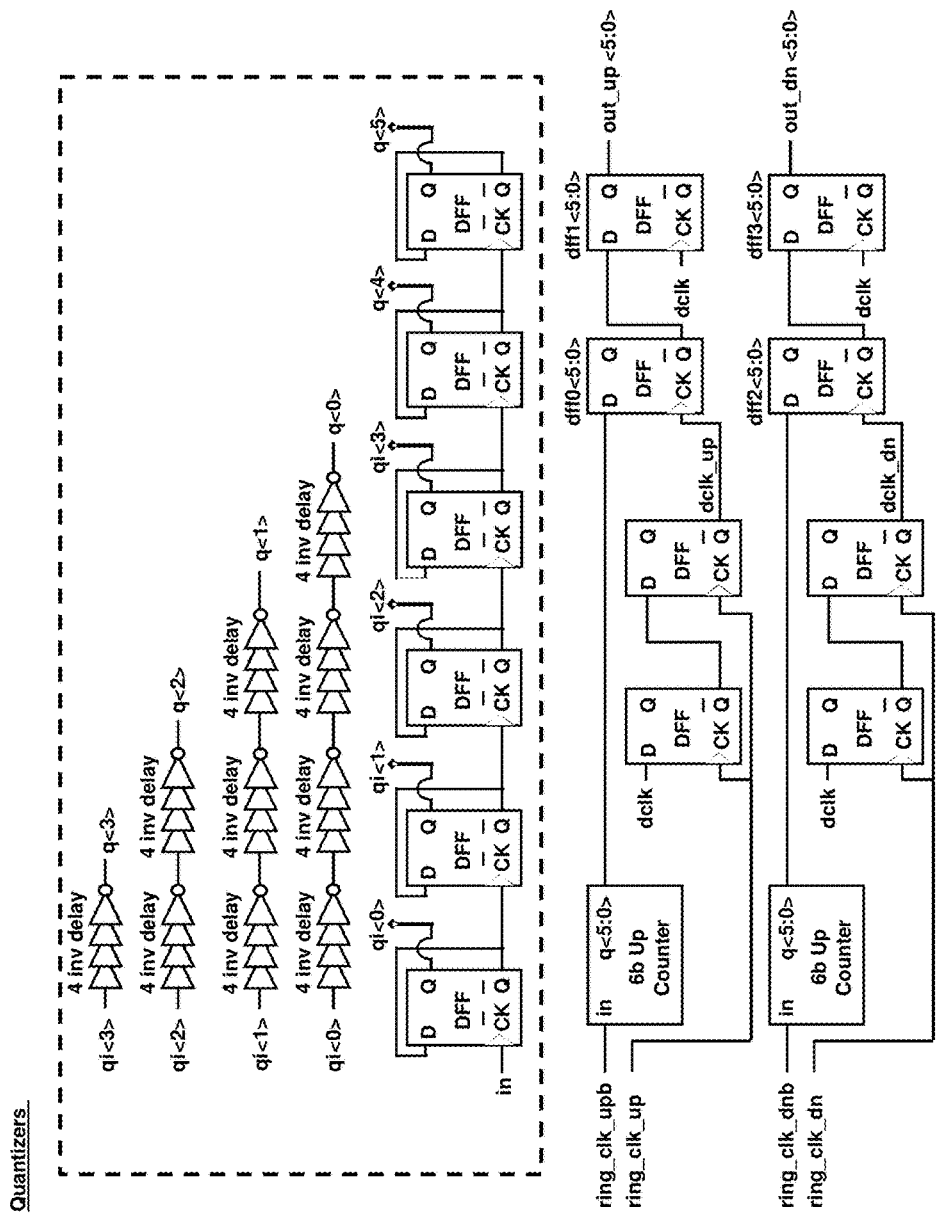
FIG. 20 illustrates an exemplary embodiment of quantizer circuitry and technique to convert VCO edges into digital codes at a rate, in this exemplary embodiment, of 24 MHz, according to certain aspects of the present inventions.

FIG. 20 illustrates a quantizer circuit which converts the VCO clock edges into digital codes every dclk transition, which is the same signal as clk24(t) (see FIG. 18). As mentioned earlier, the number of counter bits may be chosen to be large enough to avoid problems with later unwrapping operations. In one embodiment, a key challenge of this circuit is to mitigate the impact of meta-stability behavior in the counting processing while dealing with ring oscillator outputs that may have a wide range of frequency variation.

FIG. 20 includes circuitry and techniques to avoid meta-stability behavior. The first is to retime the dclk clock signal with two registers which are clocked by the respective ring oscillator output being counted. Using two registers reduces the impact of metastability in the first register which may occur due to the asynchronous relationship between dclk and the ring oscillator output. By doing so, the registers that are, in turn, clocked by this new retimed signal, dclk_up or dclk_dn, may be directly fed by the counter outputs while maintaining setup and hold time requirements such that metastability is avoided. Assuming dclk is always reasonably lower than the ring oscillator frequencies, the final output may be safely retimed to the clk24(t) clock domain. The second technique is to use an asynchronous counter structure as shown in the figure, which has an advantage of allowing lower power operation since the first stage operates at the high frequency of the ring oscillator output. However, a potential issue with this approach is that the individual bits of the asynchronous counter are skewed in time, which may create problems when sampling them with the dclk_up or dclk_dn signals. To counter this issue of time skew, inverter chains may be included, as shown in the figure, which act to delay earlier counter stages more than later stages and therefore reduce the overall spread of the timing skew such that metastability may be avoided when sampling them with the dclk_up and dclk_dn signals.

Exemplary Frequency Divider and Non-Overlapping Pulse Generator Embodiments

Figure 21:
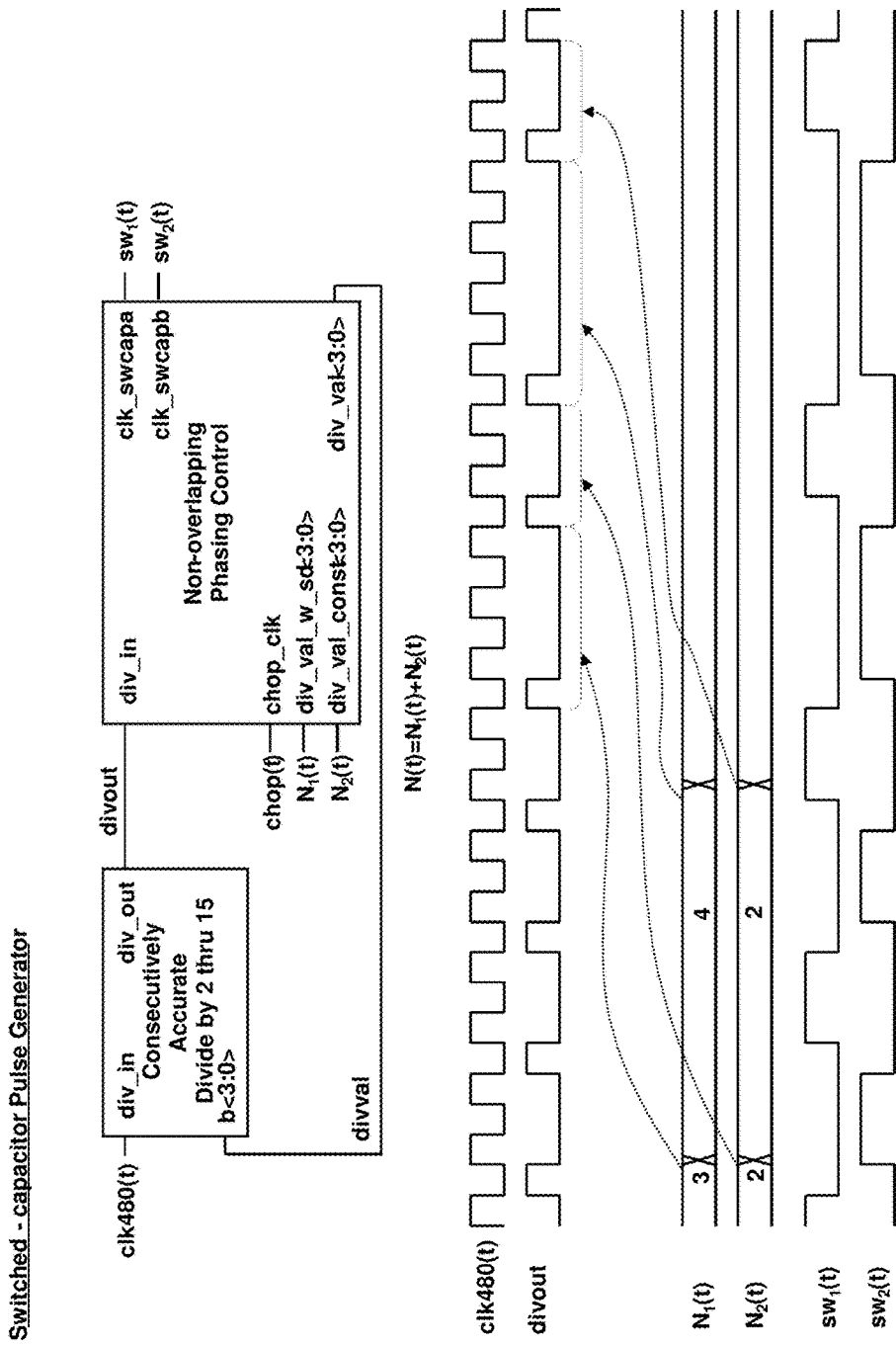
FIG. 21 illustrates an exemplary block diagram embodiment of a frequency divider and non-overlapping pulse generator for the switches within the switched capacitor network of the resistor comparison circuit, according to certain aspects of the present inventions.

FIG. 21 shows the switched-capacitor pulse generator, which consists of a consecutively accurate divide by 2 through 15 block and a non-overlapping phase control block. The fundamental clocking frequency of the switch capacitor network is formed by a pair of divide values sent to the divider, $N_1(t)$ and $N_2(t)$. Their parallel to serialization (2:1) and passage into divval is managed by the non-overlapping phase control block. For example, to switch the capacitor network at 48 MHz, it's straightforward to see that this may be obtained by dividing the 480 MHz clock by 10. This amounts to counting 10 pulses from the 480 MHz clock to produce each rising (or falling) edge of the 48 MHz output. Since the ultimate divider value applied to the switch capacitor is formed by a pair of divide values, it is possible to first divide by 6 ($N_1(t)$) and then by 4 ($N_2(t)$) to achieve the divide by 10 goal. In other words, a total count of 10 pulses is achieved by counting 6 and then by 4 pulses. The first divide value, $N_1(t)$, specifies the Sigma-Delta divide value: attaching the switch cap to the filter capacitor—swcapa. The second value, $N_2(t)$, specifies the constant value that does not change once the part is configured: resetting the switch cap to ground—swcapb. The outputs of the non-overlapping phase control partitions which the divide sequence corresponds to swcapa or swcapb, and also ensures that there is at least a 1/480 MHz period of time where both swcapa and swcapb are low to ensure non-overlapping clocking behavior.

The consecutively accurate divider (schematic shown in FIG. 22), in one embodiment, switches to any divide value supported by the circuit on the fly or in situ and perform the division without pause or error. In this particular circuit, the possible choices of divide value are between 2 and 15. This ability is enabled by the circuits between the $2^{nd}$ and $3^{rd}$ div2or3 cell (counting from left to right) and the retiming latches (DFF0, LTCH0, LTCH1, and LTCH2).

Figure 23:
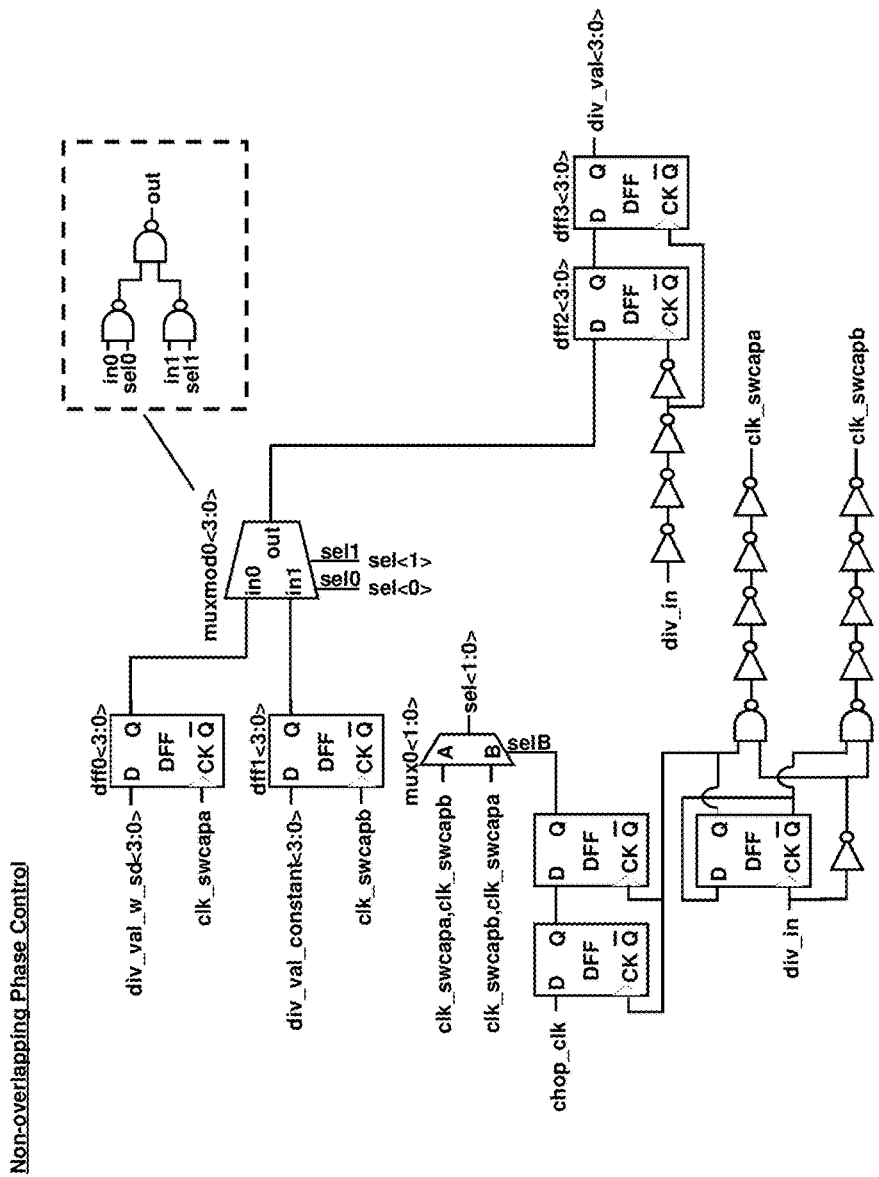
FIG. 23 illustrates an exemplary schematic block diagram embodiment of a non-overlapping phase control circuitry and techniques, according to certain aspects of the present inventions.

The non-overlapping phase control shown in FIG. 23 performs parallel to serial conversion of $N_1(t)$ and $N_2(t)$ into $N(t)$, and also retimes digital data into the local divider clock domain. It also performs the correct swapping of divide value correspondence to clk_swcapa & clk_swcapb when chop_clk(t) is either high or low. Finally, this circuit also generates the 1/480 MHz non-overlapping time period between adjacent falling and rising edges of clk_swcapa and clk_swcapb through the and gates shown at the bottom of FIG. 23. Clk_swcapa and clk_swcapb are fed directly to CLKph1 and CLKph2 respectively, found in FIGS. 9 and 10.

Figure 22:
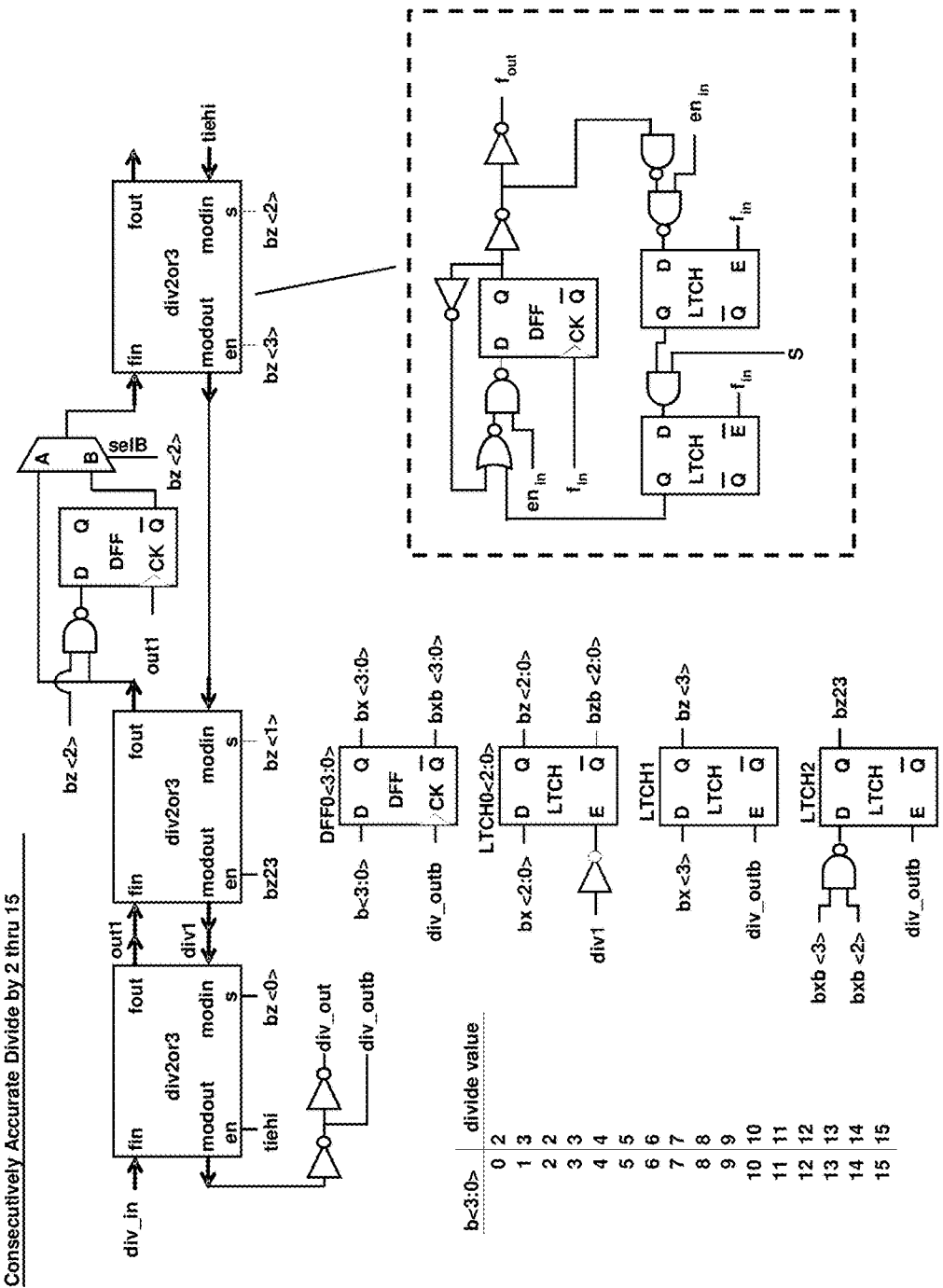
FIG. 22 illustrates an exemplary frequency divider and technique embodiment for the switches within the switched capacitor network, according to certain aspects of the present inventions.

While the exemplary frequency divider circuits shown in FIGS. 22 and 23 have advantages of providing a low power implementation, one should note that more conventional divider structures may be employed. For instance, rather than using the asynchronous structure in FIG. 22, a synchronous divider structure may be used instead. The best choice of frequency divider may depend on the fabrication process utilized and the operating frequencies involved.

Figure 24:
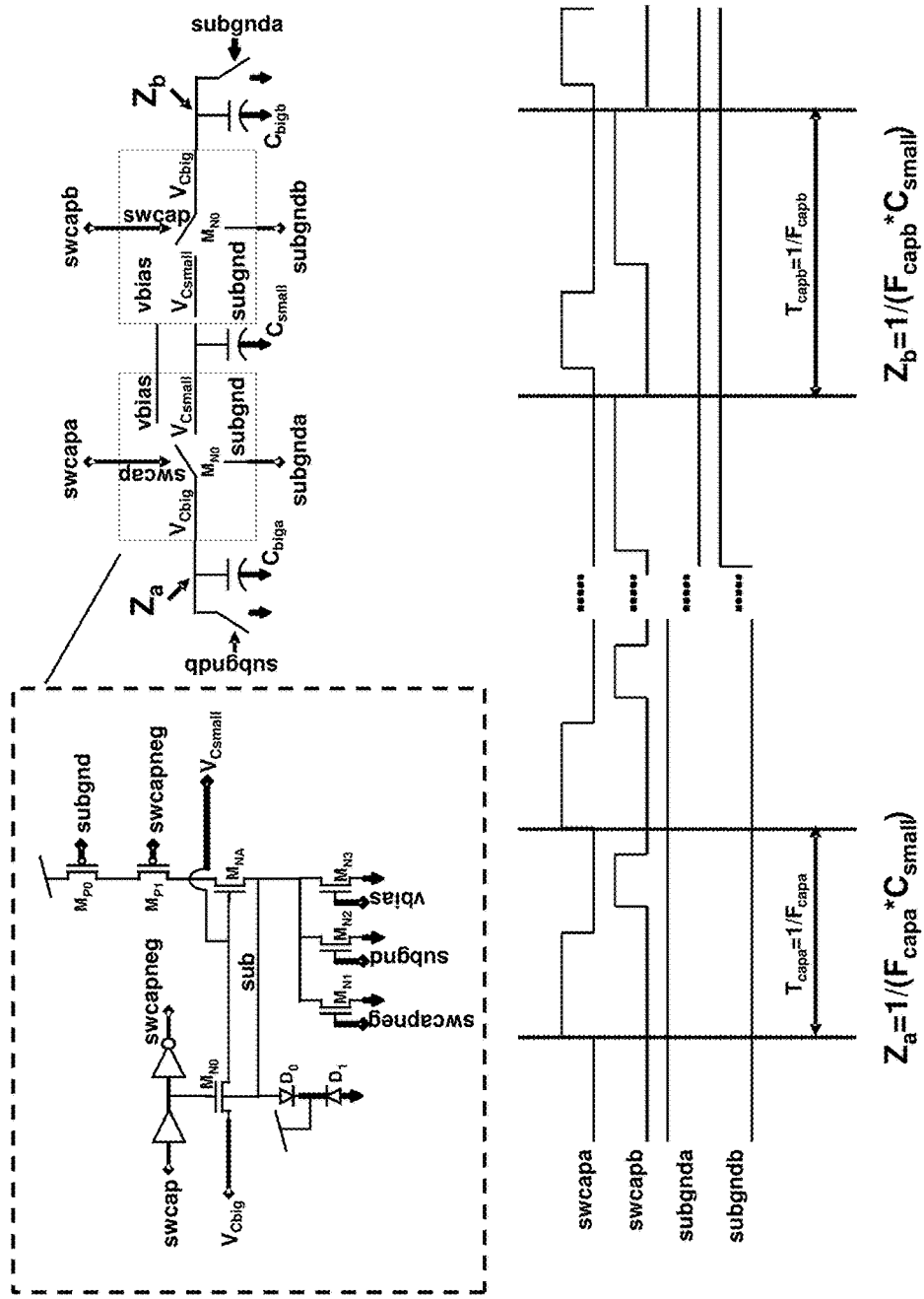
FIG. 24 illustrates an exemplary switched capacitor and technique embodiment, according to certain aspects of the present inventions.

In one embodiment, a lower on-resistance for the switched-capacitor switch $M_{N0}$ shown in FIG. 24, is provided by coupling and/or connecting the bulk to the source side that is attached to $V_{Csmall}$. The voltages work out such that the bulk is not biased above either the source or drain. However, this causes $D_0$ to appear in parallel with $C_{small}$ (switched capacitor). Since $C_{small}$ is constructed with a fingered metal cap, it may have a low temperature coefficient. $D_0$ has capacitance that varies with temperature, which if placed in parallel with $C_{small}$, causes the effective switched capacitor to vary with temperature, which is undesirable. To isolate $D_0$ from the switched capacitor, but still allow a lower on-resistance for $M_{N0}$, $V_{Csmall}$ is buffered by a native NMOS $M_{NA}$ follower. The native NMOS provides a low Vt, which allows sub to stay relatively close and slightly under the source voltage. Subgnd is also included in the circuit and allows the substrate to be grounded all the time, when the chop_clk (t) flips and turns the left side into the reset switch, and right side into the switchcap switch.

Figure 25:
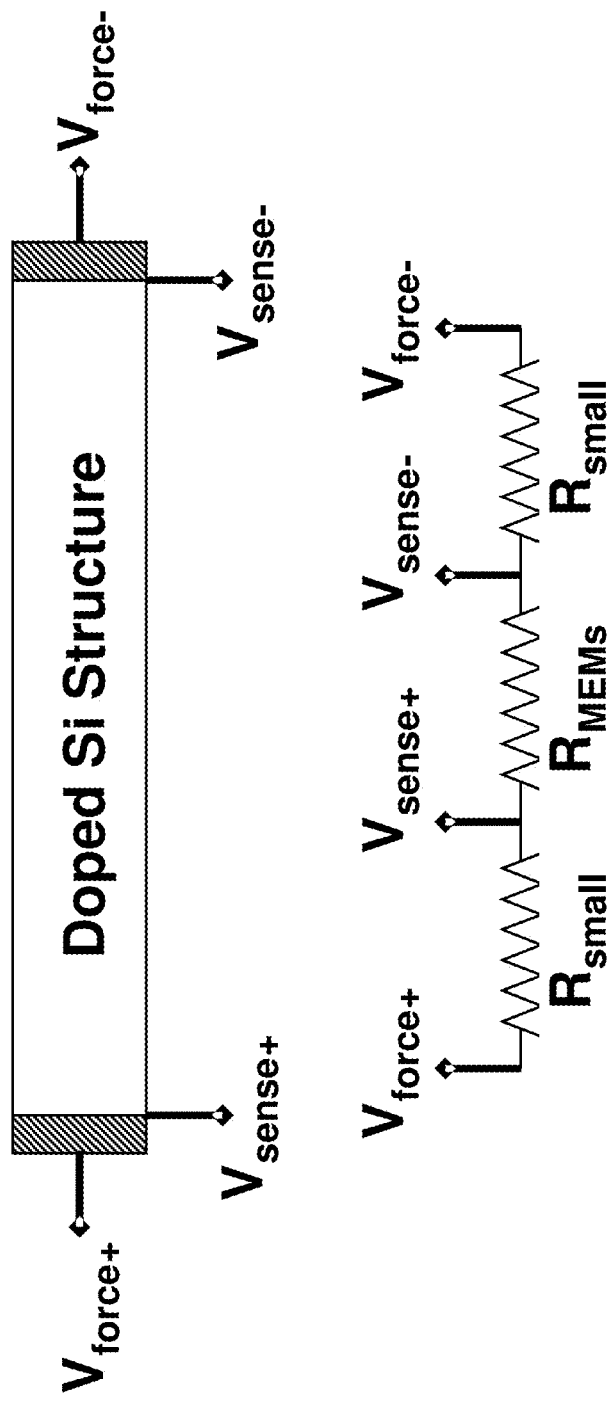
FIG. 25 illustrates an exemplary embodiment of a four terminal resistor including sense and force "terminals", according to certain aspects of the present inventions.

In addition to supporting a 2-wire or 2-point MEMs resistor structure (where the terminals exist only at $V_{force+}$ and $V_{force-}$, the system may utilize a 4-wire or 4-point MEMs resistor structure (FIG. 25) to provide accurate measurement of $R_{MEMs}$, effectively removing the influence of the interface resistance labeled as $R_{int}$. Embodiments of the micromachined thermistor structure, and operation and/or fabrication thereof, are discussed and/or illustrated in ATTACHMENT A of the Provisional Application.

Figure 26:
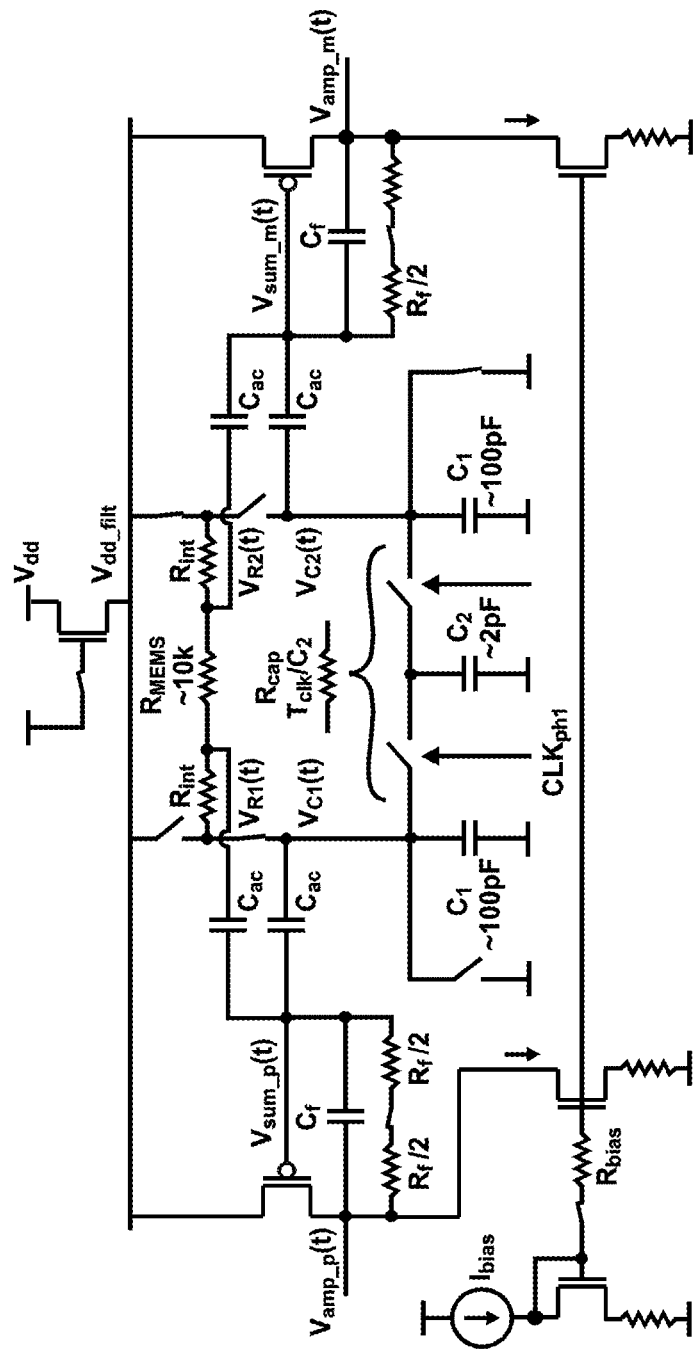
FIG. 26 illustrates a schematic representation of an exemplary embodiment of a temperature to digital converter circuitry, according to certain aspects of the present inventions.

FIG. 26 shows how the TDC is configured with a 4-wire MEMs structure. By tapping $C_{ac}$ from $V_{sense+/-}$, the circuit effectively measures the voltage formed across $R_{MEMs}$ only.

Figure 27:
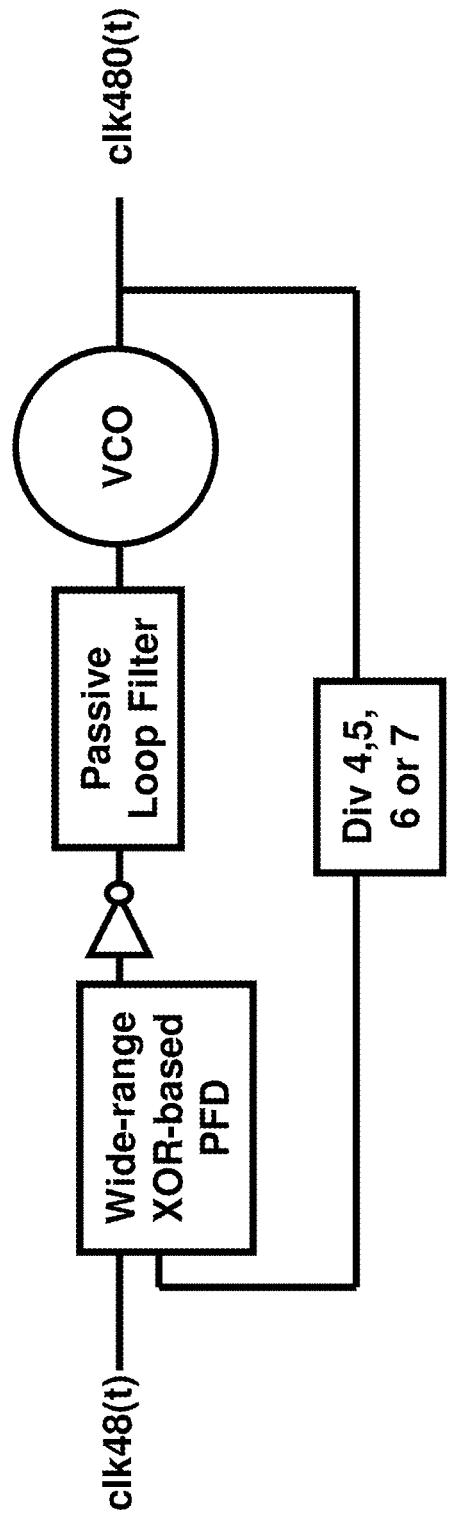
FIG. 27 illustrates an exemplary block diagram of a clock multiplier, which may be implemented in conjunction with the present inventions according to certain aspects thereof.

The Clock multiplier shown in FIG. 27 takes the output of the MEMs oscillator (assumed to be 96 Hz for this example) as the reference and multiplies it by the divider value (nominally 5) to generate the clk480(t) clock signal as required by the TDC. This way, the switched capacitor resistance used in the TDC will be proportional to the MEMs frequency, which behaves very consistently across temperature. As such, the impact of such frequency variations may be corrected within a temperature compensation algorithm. The wide-range XOR based PFD allows the PFD to lock with an initial feedback frequency in the range of 1/3 $F_{MEMs}$ to $3*F_{MEMs}$. The passive loop filter may be based on a switched resistor topology, for example, the topology or architecture described and illustrated in U.S. patent application Ser. No. 12/860,875. The VCO of the illustrative embodiment is based on a ring-oscillator structure, which in addition to the configurable feedback divider value, is able to achieve a wide frequency range output for clk480 MHz. This allows the system to have yet another degree of freedom in configuring the TDC such that the entire system may accommodate different combinations of nominal MEMs resistor values and reference switched capacitor values.

Importantly, the present inventions are neither limited to any single aspect nor embodiment thereof, nor to any combinations and/or permutations of such aspects and/or embodiments. For example, the present inventions are not limited to a switched resistor PLL as stated above but may instead use a conventional PLL structure and/or components thereof including, for example, the switched resistor network, switched resistor loop filter circuitry, architectures, topologies and techniques, phase detector circuitry and technique, divider circuitry and techniques, and/or circuitry, techniques and signals to control the switched resistor network and/or switched resistor loop filter circuitry. In this way, each of the aspects of the present inventions, and/or embodiments thereof, may be employed alone or in combination with one or more of the other aspects of the present inventions and/or embodiments thereof. For the sake of brevity, many of those permutations and combinations are not discussed separately herein; however, all permutations and combinations are intended to fall within the scope of the present inventions.

As noted above, the exemplary values of the various components and switching frequency of the exemplary embodiments do not limit the invention in any manner. Rather, such values facilitate a discussion of characteristics and operation of various aspects of the circuitry and techniques of the exemplary embodiments. Moreover, the switched capacitor network according to the present inventions has an equivalent or effective resistance or impedance due to, among other things, the switching action of the network. The term resistance used in connection with the switched capacitor network denotes the equivalent or effective resistance or impedance. Indeed, the term equivalent or effective resistance should be understood in this context to mean a resistance, a generated or simulated resistance, an equivalent or effective resistance, and/or impedance.

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

Notably, the terms "first," "second," and the like, herein do not denote any order, quantity, or importance, but rather are used to distinguish one element from another. Moreover, in the claims, the terms "a" and "an" herein do not denote a limitation of quantity, but rather denote the presence of at least one of the referenced item. The term "circuit" may mean, among other things, a single component (for example, electrical/electronic and/or microelectromechanical) or a multiplicity of components (whether in integrated circuit form, discrete form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated, discrete or otherwise), one or more state machines, one or more processors, one or more processors implementing software, one or more gate arrays, programmable gate arrays and/or field programmable gate arrays.

Further, in the claims, the term "data" may mean, among other things, a current or voltage signal(s) whether in an analog or a digital form. In addition, the phrase "data which is representative of one or more temperature dependent characteristics" means data which is representative of one or more temperature dependent characteristics (absolute) and data which is representative of a change(s) one or more temperature dependent characteristics (relative).

What is claimed is:

1. A temperature sensor comprising:
   a microelectromechanical-system (MEMS) structure having a resistance that varies with temperature;
   a switched component network that exhibits an effective resistance according to the frequency of a switching signal;
   circuitry to determine a difference between the resistance of the MEMS structure and the effective resistance of the switched component network; and
   circuitry to generate a temperature output based at least in part on the difference between the resistance of the MEMS structure and the effective resistance of the switched component network.

2. The temperature sensor of claim 1 wherein the switched component network comprises a plurality of capacitive elements.

3. The temperature sensor of claim 1 wherein the circuitry to generate the temperature output comprises a signal generating circuit to generate the switching signal.

4. The temperature sensor of claim 3 wherein the signal generating circuit comprises a MEMS oscillator, distinct from the MEMS structure, to generate a reference clock signal and circuitry to cycle the switching signal between first and second signal levels at the switching signal frequency, the switching signal frequency being variable and dependent, at least in part, on the reference clock signal.

5. The temperature sensor of claim 1 wherein the circuitry to generate the temperature output comprises a signal generating circuit to generate, as the switching signal, at least first and second clock signals that cycle at the switching signal frequency and are phase offset from one another.

6. The temperature sensor of claim 1 wherein the switched component network exhibits a capacitance and wherein the circuitry to generate the temperature output comprises a signal generating circuit that cycles the switching signal at the switching signal frequency to develop a frequency-dependent voltage across the capacitance, the frequency-dependent voltage corresponding to the effective resistance of the switched component network.

7. The temperature sensor of claim 6 wherein the signal generating circuit receives a feedback signal from the circuitry that determines the difference between the resistance of the MEMS structure and the effective resistance of the switched component network.

8. The temperature sensor of claim 7 wherein the feedback signal is dependent, at least in part, on the difference between the resistance of the MEMS structure and the effective resistance of the switched component network, and wherein the signal generating circuit adjusts the switching signal frequency in response the feedback signal to form a feedback loop.

9. The temperature sensor of claim 8 wherein the signal generating circuit adjusts the switching signal frequency in a direction, toward a higher frequency or a lower frequency, that reduces the difference between the resistance of the MEMS structure and the effective resistance of the switched component network to implement a negative feedback loop.

10. The temperature sensor of claim 8 wherein the signal generating circuit adjusts the switching signal frequency by increasing or decreasing a digital control value, the circuitry to generate the temperature output comprising circuitry to generate, as a temperature output, a digital output value based, at least in part, on the digital control value.

11. A method of operation within a temperature sensor having a microelectromechanical-system (MEMS) structure, the method comprising:
- generating, within a switched component network, an effective resistance according to the frequency of a switching signal;
- determining a difference between a temperature-dependent resistance of the MEMS structure and the effective resistance of the switched component network; and
- generating a temperature output based at least in part on the difference between the resistance of the MEMS structure and the effective resistance of the switched component network.

12. The method of claim 11 wherein generating the temperature output comprises generating the switching signal within a signal generating circuit that includes a MEMS oscillator, the MEMS oscillator being distinct from the MEMS structure.

13. The method of claim 12 wherein generating the switching signal within the signal generating circuit comprises enabling the MEMS oscillator to generate a reference clock signal and cycling the switching signal between first and second signal levels at the switching signal frequency, the switching signal frequency being variable and dependent, at least in part, on the reference clock signal.

14. The method of claim 12 wherein generating the switching signal comprises generating, as component signals of the switching signal, first and second clock signals that cycle at the switching signal frequency and are phase offset from one another.

15. The method of claim 11 wherein the switched component network comprises a plurality of passive components interconnected by switch elements and wherein generating the effective resistance within the switched component network comprises cycling the switch elements between conducting and non-conducting states.

16. The method of claim 11 wherein the switched component network exhibits a capacitance and wherein generating the effective resistance comprises cycling the switching signal at the switching signal frequency to develop a frequency-dependent voltage across the capacitance, the frequency-dependent voltage corresponding to the effective resistance.

17. The method of claim 16 wherein generating the temperature output based at least in part on the difference between the resistance of the MEMS structure and the effective resistance of the switched component network comprises generating a feedback signal based on the difference between the resistance of the MEMS structure and the effective resistance of the switched component network and wherein cycling the switching signal at the switching signal frequency to develop a frequency-dependent voltage across the capacitance comprises cycling the switching signal at a frequency determined, at least in part, by the feedback signal.

18. The method of claim 17 wherein cycling the switching signal at the frequency determined, at least in part, by the feedback signal comprises adjusting the switching signal frequency in a direction, toward a higher frequency or a lower frequency in accordance with the feedback signal, that reduces the difference between the resistance of the MEMS structure and the effective resistance of the switched component network.

19. The method of claim 18 wherein adjusting the switching signal frequency comprises increasing or decreasing a digital control value that controls the switching signal frequency, and wherein generating the temperature output comprises generating a digital output value representative of temperature based, at least in part, on the digital control value.

20. A temperature sensor comprising:
- a microelectromechanical-system (MEMS) structure having a resistance that varies with temperature;
- means for generating, within a switched component network, an effective resistance according to the frequency of a switching signal;
- means for determining a difference between the resistance of the MEMS structure and the effective resistance of the switched component network; and
- generating a temperature output based at least in part on the difference between the resistance of the MEMS structure and the effective resistance of the switched component network.

* * * * *